(12) United States Patent
Leung et al.

(10) Patent No.: US 6,732,229 B1
(45) Date of Patent: May 4, 2004

(54) METHOD AND APPARATUS FOR MEMORY REDUNDANCY WITH NO CRITICAL DELAY-PATH

(75) Inventors: Wingyu Leung, Cupertino, CA (US); Jui-Pin Tang, San Jose, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/503,751

(22) Filed: Feb. 14, 2000

Related U.S. Application Data

(63) Continuation-in-part of application No. 09/256,746, filed on Feb. 24, 1999, now abandoned.

(51) Int. Cl.[7] .............................................. G06F 12/00
(52) U.S. Cl. .......................... 711/109; 714/6; 365/200
(58) Field of Search ............................ 714/6, 7, 8, 709, 714/710, 711; 713/401; 365/225.7, 200, 201, 230.01, 230.02, 230.03, 230.04, 230.05; 711/109, 103

(56) References Cited

U.S. PATENT DOCUMENTS

| | | | | |
|---|---|---|---|---|
| 4,281,398 A | | 7/1981 | McKenny et al. .......... 365/200 |
| 5,204,836 A | | 4/1993 | Reed | |
| 5,301,153 A | | 4/1994 | Johnson | |
| 5,359,561 A | | 10/1994 | Sakomura et al. .......... 365/201 |
| 5,761,138 A | | 6/1998 | Lee et al. .................... 365/200 |
| 5,764,577 A | | 6/1998 | Johnston et al. | |
| 5,768,196 A | * | 6/1998 | Bloker et al. ................ 365/200 |
| 5,796,662 A | * | 8/1998 | Kalter et al. ................ 365/200 |
| 5,835,430 A | | 11/1998 | Henning et al. ............. 365/201 |
| 5,907,511 A | * | 5/1999 | Crafts ......................... 365/191 |
| 5,920,515 A | | 7/1999 | Shaik et al. ................. 365/200 |
| 5,954,828 A | * | 9/1999 | Lin .............................. 714/723 |
| 5,991,902 A | * | 11/1999 | Yoshida ....................... 714/710 |
| 6,011,733 A | | 1/2000 | Fischer et al. .............. 365/200 |
| 6,021,512 A | * | 2/2000 | Lattimore et al. .......... 714/710 |
| 6,144,591 A | | 11/2000 | Vlasenko et al. ........... 365/200 |
| 6,172,935 B1 | * | 1/2001 | Wright et al. ............... 365/233 |

* cited by examiner

*Primary Examiner*—Pierre-Michel Bataille
(74) *Attorney, Agent, or Firm*—Bever, Hoffman & Harms, LLP; E. Eric Hoffman

(57) ABSTRACT

A memory redundancy scheme is provided for re-routing data signal paths to disconnect defective memory blocks in a memory array. Each memory block is provided with a corresponding routing unit. Each routing unit is coupled to its corresponding memory block and at least one additional adjacent memory block. The routing units are configured to route data between functional memory blocks and a data bus. The routing units are controlled by configuration values stored in a shifter circuit, which extends through the routing units. To replace a defective memory block, the address of the defective memory block is identified. Configuration values are serially loaded into the shifter circuit, wherein the configuration values are selected in response to the address of the defective memory block. The configuration values cause the routing units to bypass the defective memory block, connect a redundant memory block, and shift connections in the memory blocks located between the redundant memory block and the defective memory block.

21 Claims, 16 Drawing Sheets

US 6,732,229 B1

METHOD AND APPARATUS FOR MEMORY REDUNDANCY WITH NO CRITICAL DELAY-PATH

RELATED APPLICATIONS

The present application is a continuation-in-part of U.S. patent application Ser. No. 09/256,746, by Wingyu Leung and Jui-Pin Tang, filed Feb. 24, 1999, now abandoned.

FIELD OF THE INVENTION

The present invention is related to semiconductor memories. In particular, the present invention relates to the implementation of column redundancy for semiconductor memories, whereby defective columns of a memory array are replaced with redundant columns.

DISCUSSION OF RELATED ART

A semiconductor memory typically includes redundant circuitry to increase the functional yield. In general, the redundant circuitry can be classified as row redundant circuitry or column redundant circuitry. Row redundant circuitry includes one or more redundant rows of memory cells and the associated circuitry required to activate the redundant rows and de-activate defective rows of memory cells. Similarly, column redundant circuitry includes one or multiple redundant columns of memory cells and the associated circuitry required to activate the redundant columns and de-activate defective columns of memory cells.

Most conventional column redundancy schemes use one or more dedicated redundant blocks, which can be used to repair any defective blocks. Each redundant block is coupled in parallel with the normal blocks by a programmable element, such as a fuse or anti-fuse. The programmable elements are used to selectively connect the read and write data terminals to a normal block or a redundant block. Each redundant block is capable of being connected to the read and write data terminals associated with any one of the normal blocks. Because each redundant block must be capable of connection to every normal block, long routing paths exist between the redundant blocks and the normal blocks. The long routing paths can create speed critical paths for the memory. Such a column redundancy scheme is illustrated in FIG. 1.

FIG. 1 is a schematic diagram of a memory circuit 100 that implements a conventional redundancy scheme. Memory circuit 100 includes a memory cell array 101 having a plurality of rows and columns. Memory cell array 101 is subdivided into 130 memory blocks $MB_{129}$–$MB_0$. Each of the memory blocks $MB_{129}$–$MB_0$ includes 8 columns and 1024 rows of memory cells. If memory blocks $MB_{127}$–$MB_0$ are not defective, these memory blocks are accessed during the normal operation of memory circuit 100. Memory blocks $MB_{129}$ and $MB_{128}$ are redundant memory blocks that are used to replace up to two defective memory blocks.

Each of memory blocks $MB_{129}$–$M_0$ is coupled to a corresponding 8-to-1 column decoder $CD_{129}$–$CD_0$. Each of column decoders $CD_{129}$–$CD_0$ is coupled to a corresponding data line $D_{129}$–$D_0$. Data lines $D_{129}$–$D_0$ normally carry data signals D[129:0], respectively. Each of column decoders $CD_{129}$–$CD_0$ is controlled to couple one of the eight columns in its corresponding memory block to its corresponding data line. For example, column decoder $CD_3$ couples one of the eight columns of memory block $MB_3$ to data line $D_3$.

Each of data lines $D_{127}$–$D_0$ includes a fuse that can be blown if the associated memory block or column decoder is defective. For example, data line $D_3$ includes fuse 103.

Column decoders $CD_{129}$ and $CD_{128}$ are coupled to redundant data lines $D_{129}$ and $D_{128}$, respectively. These redundant data lines $D_{129}$ and $D_{128}$ extend the width of the memory circuit 100, traversing data lines $D_{127}$–$D_0$. An anti-fuse is provided between each of redundant data lines $D_{129}$–$D_{128}$ and each of the normal data lines $D_{127}$–$D_0$. For example, anti-fuse 104 is coupled between redundant data line $D_{128}$ and data line $D_3$. Similarly, anti-fuse 105 is coupled between redundant data line $D_{129}$ and data line $D_3$.

If all of memory blocks $MB_{127}$–$MB_0$ and column decoders $CD_{127}$–$CD_0$ are free of defects, then none of the fuses or anti-fuses are blown. As a result, column decoders $CD_{127}$–$CD_0$ are coupled to data lines $D_{127}$–$D_0$, respectively. However, if one of memory blocks $MB_{127}$–$MB_0$ or column decoders $CD_{127}$–$CD_0$ is defective, then the fuse associated with the defective memory block/column decoder is blown, thereby de-coupling the defective memory block/column decoder from its associated data line. An associated anti-fuse is then blown to couple the isolated data line to one of the redundant data lines.

For example, if memory block $MB_3$ is defective, then fuse 103 is blown to de-couple memory block $M_3$ and column decoder $CD_3$ from data line $D_3$. Anti-fuse 104 is then blown, thereby coupling data line $D_3$ to redundant data line $D_{128}$. Under these conditions, redundant memory block $MB_{128}$ and redundant column decoder $CD_{128}$ provide service to data line $D_3$. Redundant memory block $MB_{129}$ and redundant column decoder $CD_{129}$ can replace a second defective memory block/column decoder in a similar manner.

When redundant data lines $D_{129}$ and $D_{128}$ are used to route data values, relatively long interconnection delays can exist because of the length of these redundant data lines. In the example described above, the path from data line $D_3$ to column decoder $CD_{128}$ is much longer than any of the other data paths. This interconnection delay becomes intolerable as the ratio of the number of normal columns to the number of redundant columns increases, especially in embedded memory design. The long interconnection delay can create a critical path that effectively increases the access time of memory circuit 100.

It would therefore be desirable to have a memory system that provides redundancy without adding excessive interconnection delays.

SUMMARY

Accordingly, the present invention provides a memory redundancy scheme for re-routing the data signal paths to disconnect defective memory blocks within a memory array. To implement the redundancy scheme, each of the memory blocks is provided with a corresponding routing control unit. Each of the routing control units includes a fuse which is blown if the corresponding memory block is defective. The routing control units are connected in a chain. A code signal having predetermined default value is provided to a routing control unit at the end of the chain. The code signal is routed along the chain through the routing control units. The code signal is passed through each routing control unit unchanged, unless the routing control unit has a blown fuse. In this case, the routing control unit modifies the code signal. The modified code signal is then passed to the next routing control unit in the chain. In this manner, each routing control unit receives information for all the previous fuses in the chain, adds its own fuse information, and then passes a representative code signal to the next routing control unit. Each routing control unit selects a data signal path in response to its received code signal and the state of its fuse.

If the code signal indicates the presence of a defective memory block, the data signal path is modified such that data signals are re-routed to the next or previous memory blocks, depending on the memory array function (read or write). Thus, logically, a defective memory block is disconnected from the original data signal path and replaced by a neighboring memory block. Because each data signal path is only re-routed at most by one (or two) memory blocks, the delays on the various data signal paths are substantially identical. Moreover, the access time with the redundancy scheme is approximately the same as the access time of a memory system without a redundancy scheme. In addition, the above-described process only needs to be performed once after power-on reset. As a result, the normal operation of the memory array will not be affected by the redundancy scheme.

In another embodiment of the present invention, a memory redundancy scheme is provided for re-routing data signal paths to disconnect defective memory blocks in a memory array. Each memory block is provided with a corresponding routing unit. Each routing unit is coupled to its corresponding memory block and at least one additional adjacent memory block. The routing units are configured to route data between functional memory blocks and a data bus. The routing units are controlled by configuration values stored in a shifter circuit, which extends through the routing units. To replace a defective memory block, the address of the defective memory block is identified. Configuration values are serially loaded into the shifter circuit, wherein the configuration values are selected in response to the address of the defective memory block. The configuration values cause the routing units to bypass the defective memory block, connect a redundant memory block, and shift connections in the memory blocks located between the redundant memory block and the defective memory block.

The present invention will be more fully understood in view of the following description and drawings.

DETAILED DESCRIPTION

Figure 1:
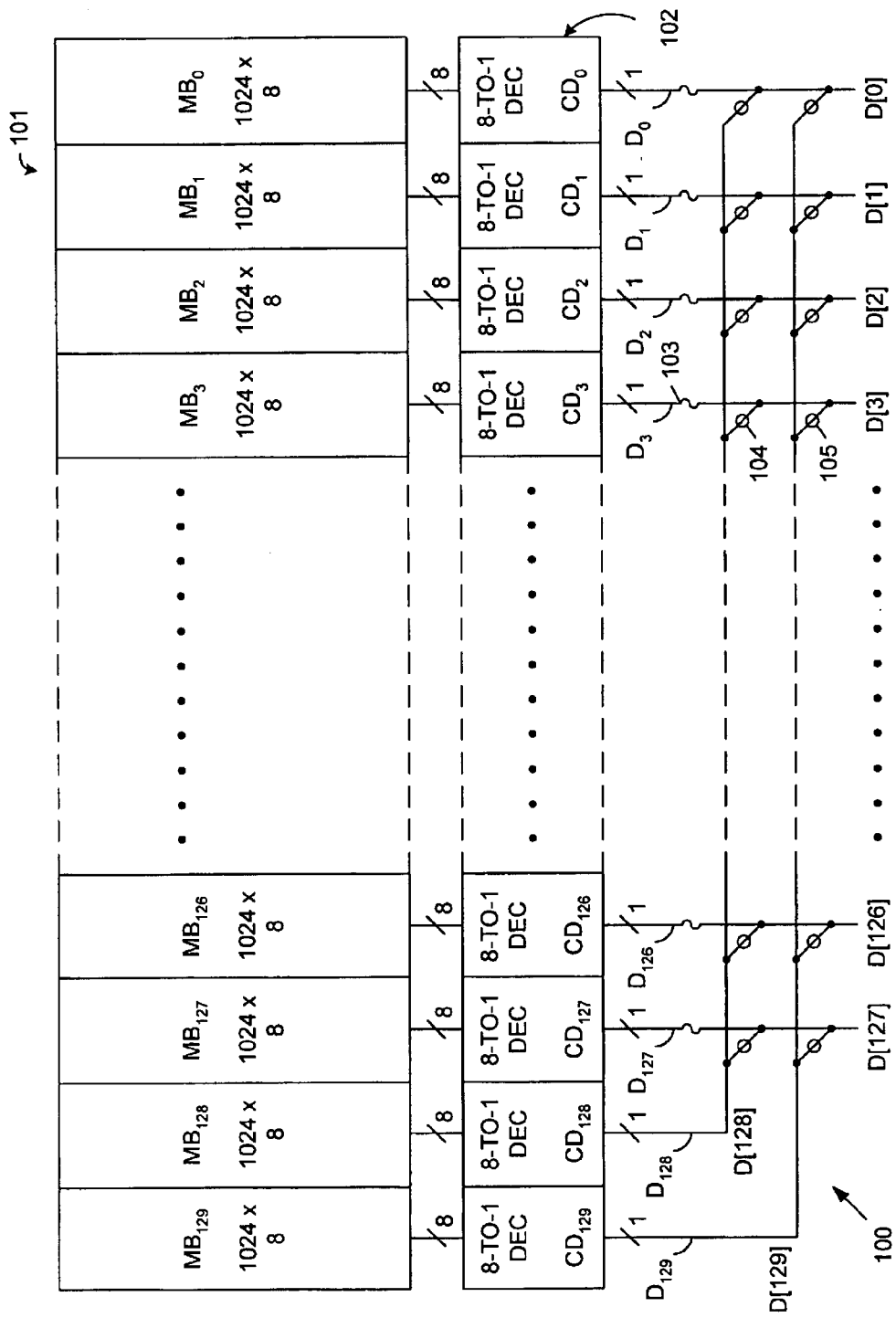
FIG. 1 is a block diagram of a conventional memory circuit that has a redundancy scheme that uses relatively long interconnection delay paths.
Figure 2:
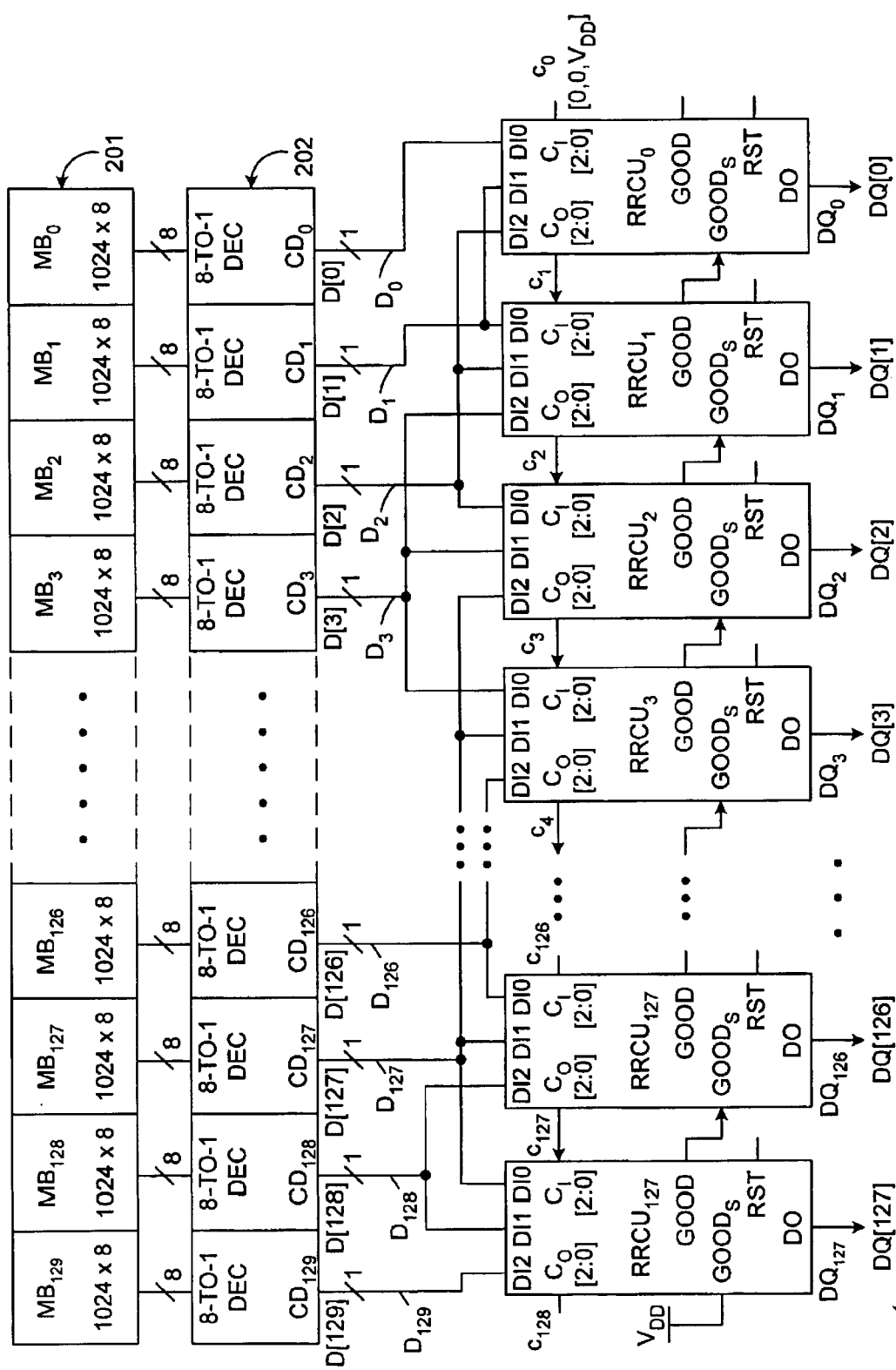
FIG. 2 is a block diagram of a memory system that implements a read redundancy scheme accordance with one embodiment of the present invention.

FIG. 2 is a block diagram of a portion of a memory system 200 that implements a read redundancy scheme in accordance with one embodiment of the present invention. Memory system 200 includes a memory cell array 201 having a plurality of rows and columns. Memory cell array 201 is subdivided into 130 memory blocks $MB_{129}$–$MB_0$. Each of the memory blocks $MB_{129}$–$MB_0$ includes 8 columns and 1024 rows of memory cells.

Each of memory blocks $MB_{129}$–$M_0$ is coupled to a corresponding 8-to-1 column decoder $CD_{129}$–$CD_0$. Each of column decoders $CD_{129}$–$CD_0$ is coupled to a corresponding data line $D_{129}$–$D_0$. Data lines $D_{129}$–$D_0$ carry data signals D[129:0], respectively. Each of column decoders $CD_{129}$–$CD_0$ is controlled to couple one of the eight columns in its corresponding memory block to its corresponding data line. For example, column decoder $CD_3$ couples one of the eight columns of memory block $MB_3$ to data line $D_3$.

Memory system 200 also includes read routing control units $RRCU_{127}$–$RRCU_0$, which route data values from column decoders $CD_{129}$–$CD_0$ to output data lines $DQ_{127}$–$DQ_0$ as output data values DQ[127:0]. Each of the 128 read routing control units $RRCU_{127}$–$RRCU_0$ is coupled to a corresponding one of the 128 output data lines $DQ_{127}$–$DQ_0$.

As described above, there are two more memory block/column decoder pairs (130) than read routing control units (128). As described in more detail below, the two additional memory block/column decoder pairs allow up to two defective memory block/column decoder pairs to be replaced.

Each of the read routing control units $RRCU_{127}$–$RRCU_0$ is coupled to receive three data values from three consecutive column decoder circuits. More specifically, each read routing control unit $RRCU_N$ is coupled to receive a first data value D[N] from a corresponding column decoder $CD_N$, a second data value D[N+1] from a first subsequent read routing control unit $RRCU_{N+1}$, and a third data value D[N+2] from a second subsequent read routing control unit $RRCU_{N+2}$. For example, read routing control unit $RRCU_0$ receives data value D[0] from column decoder $CD_0$, data value D[1] from column decoder $CD_1$, and data value D[2]

from column decoder $CD_2$. Each read routing control unit routes one of the three received data values to its associated output data line. Thus, read routing control unit $RRCU_0$ routes one of the data values D[0], D[1] or D[2] to output data line $DQ_0$.

If none of memory blocks $MB_{127}$–$MB_0$ or column decoders $CD_{127}$–$CD_0$ is defective, then data values D[127:0] are routed through read routing control units $RRCU_{127}$–$RRCU_0$, respectively. In this case, redundant memory blocks $MB_{129}$–$MB_{128}$ and redundant column decoders $CD_{129}$–$CD_{128}$ are not used.

If one of memory blocks $MB_{127}$–$MB_0$ or column decoders $CD_{127}$–$CD_0$ is defective, then the data value associated with the defective memory block/column decoder pair is not routed through the corresponding read routing control unit. Instead, the data value associated with the first subsequent memory block/column decoder pair is routed through the read routing control unit associated with the defective memory block/column decoder pair (assuming that the subsequent memory block/column decoder pair is not defective).

If the subsequent memory block/column decoder pair is also defective, then the data value associated with the second subsequent memory block/column decoder pair is routed through the read routing control unit associated with the original defective memory block/column decoder pair.

For example, if memory block $MB_1$ and/or column decoder $CD_1$ is defective, then read routing control unit $RRCU_1$ routes the data value D[2] from column decoder $CD_2$ as output data value DQ[1]. This allows memory block $MB_2$ and column decoder $CD_2$ to replace memory block $MB_1$ and column decoder $CD_1$. Read routing control unit $RRCU_2$ then routes the data value D[3] from column decoder $CD_3$ as output value DQ[2]. This allows memory block $MB_3$ and column decoder $CD_3$ to replace memory block $MB_2$ and column decoder $CD_2$. In this example, each of read routing control units $RRCU_{127}$–$RRCU_1$ routes a data value from a subsequent memory block/column decoder pair. Thus, at the left-most edge of memory system 200, read routing control unit $RRCU_{127}$ routes the data value D[128] from redundant memory block $MB_{128}$ and redundant column decoder $CD_{128}$ as output value DQ[127].

If both memory block/column decoder pair $MB_1/CD_1$ and memory block/column decoder pair $MB_2/CD_2$ are defective, then read routing control unit $RRCU_1$ routes the data value D[3] from column decoder $CD_3$ as output value DQ[1], and read routing control unit $RRCU_2$ routes the data value D[4] from column decoder $CD_4$ as output value DQ[2]. In this example, each of read routing control units $RRCU_{127}$–$RRCU_1$ routes a data value from a second subsequent memory block/column decoder pair. Thus, at the left-most edge of memory system 200, read routing control unit $RRCU_{127}$ routes the data value D[129] from redundant memory block $MB_{129}$ and redundant column decoder $CD_{129}$ as output value DQ[127].

In this manner, up to two defective memory block/column decoder pairs can be replaced using redundant memory blocks $MB_{129}$–$MB_{128}$ and redundant column decoders $CD_{129}$–$CD_{128}$. At most, data values from the column decoders $CD_{129}$–$CD_0$ are shifted to the right by two read routing control units. As a result, the delays in transmitting data values D[129:0] from column decoders $CD_{129}$–$CD_0$ to output lines $DQ_{127}$–$DQ_0$ are approximately equal, even under worst case routing conditions. That is, no routing paths are significantly longer than any other routing paths, regardless of which memory block/column decoder pairs are defective.

Note that the present invention is capable of replacing any two defective memory block/column decoder pairs, and not just two adjacent defective memory block/column decoder pairs. For example, assume that memory blocks $MB_2$ and $MB_{126}$ are defective. In this case, read routing control units $RRCU_1$ and $RRCU_0$ are controlled to route the data values D[1] and D[0], respectively, from column decoders $CD_1$ and $CD_0$, respectively, as output values DQ[1] and DQ[0], respectively. Because memory block $MB_2$ is defective, read routing control units $RRCU_{124}$–$RRCU_2$ are controlled to route the data values D[125]–D[3], respectively, from column decoders $CD_{125}$–$CD_3$, respectively, as output values DQ[124]–DQ[2], respectively. Because memory block $MB_{126}$ is also defective, read routing control units $RRCU_{127}$–$RRCU_{125}$ are controlled to route the data values D[129]–D[127], respectively, from column decoders $CD_{129}$–$CD_{127}$, respectively, as output values DQ[127]–DQ[125], respectively.

Figure 3:
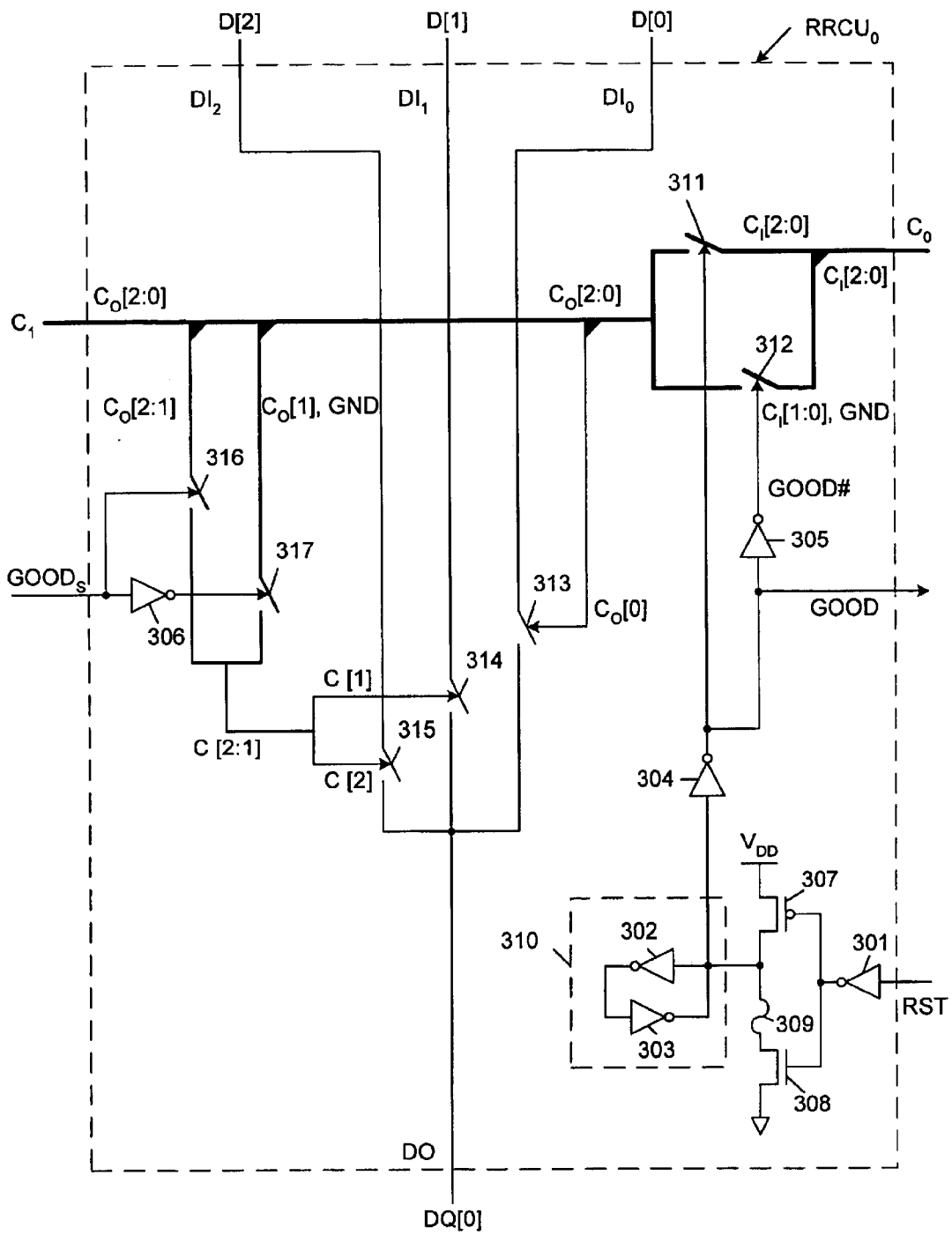
FIG. 3 is a block diagram of a read routing control unit in accordance with one embodiment of the present invention.

FIG. 3 is a block diagram of read routing control unit $RRCU_0$ in accordance with one embodiment of the present invention. Read routing control unit $RRCU_0$ includes inverters 301–306, p-channel transistor 307, n-channel transistor 308, fuse 309 and switches 311–316. Inverters 302 and 303 are cross-coupled to form latch 310. In the described example, read routing control units $RRCU_{127}$–$RRCU_1$ are identical to read routing control unit $RRCU_0$.

Data values D[0], D[1] and D[2] from column decoders $CD_0$, $CD_1$ and $CD_2$ are provided to input terminals $DI_0$, $DI_1$ and $DI_2$, respectively, of read routing control unit $RRCU_0$. These data values D[0], D[1] and D[2] are provided to switches 313, 314 and 315, respectively. As described in more detail below, one of these switches 313–315 is closed, thereby routing one of the three data values D[0], D[1] or D[2] as output value DQ[0]. In general, if memory block/column decoder pair $MB_0/CD_0$ is not defective, then switch 313 is closed, thereby routing data value D[0] as output value DQ[0]. If memory block/column decoder pair $MB_0/CD_0$ is defective, and first subsequent memory block/column decoder pair $MB_1/CD_1$ is not defective, then switch 314 is closed, thereby routing data value D[1] as output value DQ[0]. If the first subsequent memory block/column decoder pair $MB_1/CD_1$ is also defective, then switch 315 is closed, thereby routing data value D[2] as output value DQ[0].

Switches 313–315 are controlled as follows. During wafer test, memory blocks $MB_{129}$–$MB_0$ and column decoders $CD_{129}$–$CD_0$ are tested to determine whether these elements are defective or functional. If a memory block/column decoder pair is defective, then the fuse in the associated read routing control unit is blown. For example, if memory block/column decoder pair $MB_0/CD_0$ is defective, then fuse 309 in read routing control unit $RRCU_0$ is blown.

When memory system 200 is powered up, a logic high reset signal RST is applied to each of read routing control units $RRCU_{127}$–$RRCU_0$. Inverter 301 inverts the logic high RST signal, thereby providing a logic low signal to the gate of p-channel transistor 307. Under these conditions, p-channel transistor 307 turns on, thereby providing the $V_{DD}$ supply voltage to latch 310. At this time, latch 310 stores a logic high value. The reset signal RST is then de-asserted low, thereby causing inverter 301 to provide a logic high signal to the gates of transistors 307 and 308. Under these conditions, p-channel transistor 307 is turned off, and n-channel transistor 308 is turned on. If fuse 309 is not blown, then turned on transistor 308 provides a logic low signal to latch 310, thereby causing latch 310 to store a logic low value. However, if fuse 309 is blown, then turned on transistor 308 has no effect on the state of latch 310. Thus, latch 310 continues to store a logic high value.

The value stored by latch 310 is provided to inverter 304. In response, inverter 304 provides a control signal GOOD. The GOOD control signal will have a logic high value if the associated memory block/column decoder pair $MB_0/CD_0$ is functional. Conversely, the GOOD control signal will have a logic low value if the associated memory block/column decoder pair $MB_0/CD_0$ is defective. Inverter 305 provides a control signal, which is the inverse of the GOOD control signal, to switch 312.

Switch 311 is coupled to receive a 3-bit initial input code signal $C_0$. Within read routing control unit $RRCU_0$, the initial input code signal $C_0$ is designated $C_I[2:0]$. The initial input code signal $C_0$, which has a value of $[0,0,V_{DD}]$, is routed to switch 311 (as signal $C_I[2:0]$). The two least significant bits of signal $C_I[2:0]$ (i.e., $C_I[1:0]$) are routed to switch 312, along with a logic "0" bit (i.e., ground). This routing is performed such that bits $C_I[1:0]$ are the most significant bits provided to switch 312, and the logic "0" bit is the least significant bit provided to switch 312. Consequently, switch 312 is coupled to receive a value of $[0,V_{DD},0]$. Note that the $V_{DD}$ signal is shifted to the left by one position in the value provided to switch 312.

If the GOOD control signal has a logic high value, switch 311 is closed and switch 312 is opened. Under these conditions, the input code signal $C_I[2:0]$ of $[0,0,V_{DD}]$ is routed as an output code signal $C_O[2:0]$. Output code bit $C_O[0]$, which has a value of $V_{DD}$, is provided to switch 313, thereby causing this switch to close. As a result, data value D[0] is routed to output terminal DO as output value DQ[0]. Note that both of switches 314 and 315 receive logic low values under these conditions, thereby turning off these switches. In summary, if the memory block $MB_0$ and column decoder $CD_0$ are both functional, then read routing control unit $RRCU_0$ routes the associated data value D[0] as output data value DQ[0].

If the GOOD signal has a logic low value, switch 312 is closed and switch 311 is opened. Under these conditions, an input code signal of $[0,V_{DD},0]$ is routed through switch 312 as the output code signal $C_O[2:0]$. Output code bit $C_O[0]$, which has a logic low value, is provided to switch 313, thereby opening this switch and preventing data value D[0] from being routed to output terminal DO as output value DQ[0].

Switch 316 is coupled to receive output code bits $C_O[2:1]$, which in the present example have values of $[0,V_{DD}]$. Switch 317 is coupled to receive output code bit $C_O[1]$ and a logic "0" bit (i.e., ground), which in the present example, have values of $[V_{DD},0]$. Switches 316 and 317 are operated in response to a control signal $GOOD_S$. More specifically, control signal $GOOD_S$ controls switch 316, and the inverse of control signal $GOOD_S$ controls switch 317. Control signal $GOOD_S$ is the GOOD control signal generated by the subsequent read routing control unit $RRCU_1$.

If the subsequent memory block/column decoder pair $MB_1/CD_1$ pair is functional, then control signal $GOOD_S$ will have a logic high value, thereby closing switch 316 (and opening switch 317). Under these conditions, output code bits $C_O[2:1]$ are routed as internal code bits C[2:1] to switches 315 and 314, respectively. Internal code bits C[2:1] therefore have values of $[0,V_{DD}]$. As a result, switch 314 is closed, thereby routing data value D[1] to output terminal DO as output value DQ[0]. In summary, if the memory block/column decoder pair $MB_0/CD_0$ is defective, and subsequent memory block/column decoder pair $MB_1/CD_1$ is functional, then read routing control unit $RRCU_0$ routes the data value D[1] as output data value DQ[0].

If memory block/column decoder pair $MB_0/CD_0$ pair is defective, and the subsequent memory block/column decoder pair $MB_1/CD_1$ pair is also defective, then control signal $GOOD_S$ will have a logic low value, thereby closing switch 317 (and opening switch 316). Under these conditions, output code bit $C_O[1]$ and the ground supply are routed as internal code bits C[2:1] to switches 315 and 314, respectively. Internal code bits C[2:1] therefore have values of $[V_{DD},0]$. As a result, switch 315 is closed, thereby routing data value D[2] to output terminal DO as output value DQ[0]. In summary, if the memory block/column decoder pairs $MB_0/CD_0$ and $MB_1/CD_1$ are both defective, then read routing control unit $RRCU_0$ routes the data value D[2] as output data value DQ[0].

Note that the 3-bit code signal provided as an input code signal to each read routing control unit $RRCU_N$ is labeled as code signal $C_N$, and that the 3-bit code signal provided as an output signal from each read routing control unit $RRCU_N$ is labeled as code signal $C_{N+1}$. Thus, read routing control unit $RRCU_0$ receives input code signal $C_0$ and provides output code signal $C_1$.

Figure 4:
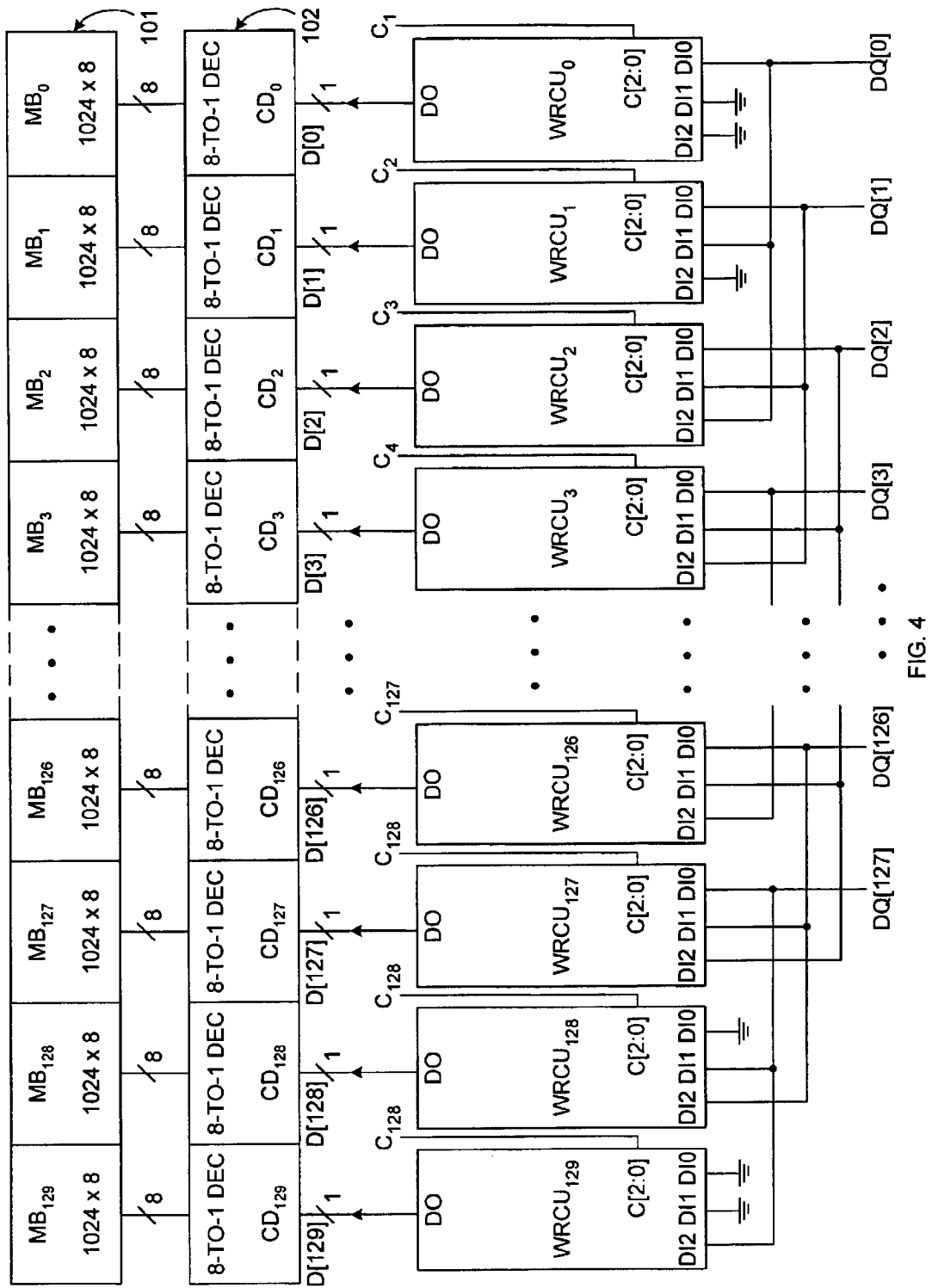
FIG. 4 is a block diagram of a portion of memory system that implements a write redundancy scheme in accordance with one embodiment of the invention.

FIG. 4 is a block diagram of a portion of memory system 200 that implements a write redundancy scheme in accordance with one embodiment of the invention. As illustrated in FIG. 4, memory system 200 additionally includes write routing control units $WRCU_{129}$–$WRCU_0$, which route data values DQ[127:0] from data lines $DQ_{127}$–$DQ_0$ to column decoders $CD_{129}$–$CD_0$. Note that each of the 130 write routing control units $WRCU_{129}$–$WRCU_0$ is coupled to a corresponding one of the 130 column decoders $CD_{129}$–$CD_0$. Further note that there are two more column decoders (130) and write routing control units (130) than data lines $DQ_{127}$–$DQ_0$ (128). As described in more detail below, the two additional write routing control units and column decoders allow up to two defective memory block/column decoder pairs to be replaced. It is not necessary for the two defective memory block/column decoder pairs to be adjacent to one another.

Each of the write routing control units $WRCU_{129}$–$WRCU_0$ is coupled to receive three input data values. More specifically, each write routing control unit $WRCU_N$ is coupled to receive a corresponding first data value DQ[N] from a corresponding data line $DQ_N$, a second data value DQ[N−1] from a first previous data line $DQ_{N−1}$ and a third data value DQ[N−2] from a second previous data line $DQ_{N−2}$ (where $2 \leq N \leq 127$). For example, write routing control unit $WRCU_2$ is coupled to receive data values DQ[2], DQ[1] and DQ[0]. Write routing control units $WRCU_{129}$ and $WRCU_{128}$ receive logic low (ground) input signals as illustrated because there are only 128 input data values (i.e., there are no data values DQ[129] or DQ[128]). Moreover, write routing control units $WRCU_1$ and $WRCU_0$ receive logic low (ground) input signals as illustrated because there is only one previous write routing control unit with respect to $WRCU_1$ (i.e., $WRCU_0$), and no previous write routing control units with respect to $WRCU_0$.

Write routing control units $WRCU_{127}$–$WRCU_0$ are further coupled to receive code signals $C_{128}$–$C_1$, respectively. These code signals $C_{128}$–$C_1$ have been described above in connection with read routing control units $RRCU_{127}$–$RRCU_0$. Write routing control units $WRCU_{129}$–$WRCU_{128}$ are coupled to receive code signal $C_{128}$.

In general, each of write routing control units $WRCU_{129}$–$WRCU_0$ routes one of its three corresponding data values as a corresponding output data value D[129:0] on data lines $D_{129}$–$D_0$. If memory blocks $MB_{127}$–$MB_0$ and column decoders $CD_{127}$–$CD_0$ are functional, then write routing control units $WRCU_{127}$–$WRCU_0$ are controlled to route data values DQ[127:0] to column decoders $CD_{127}$–$CD_0$, respectively.

If one of the memory block/column decoder pairs $MB_N$/$CD_N$ is defective, then the write routing control units $WRCU_{128}$–$WRCU_{N+1}$ are controlled to shift the data values DQ[127:N] one bit to the left in order to bypass the defective memory block/column decoder pair $MB_N$/$CD_N$. For example, if memory block/column decoder pair $MB_1$/$CD_1$ is defective, then write routing control units $WRCU_{128}$–$WRCU_2$ are controlled to route the data values DQ[127:1], respectively, to column decoders $CD_{128}$–$CD_2$, respectively.

Similarly, if two of the memory block/column decoder pairs are defective, then the write routing control units are controlled to shift the data values two bits to the left in order to bypass the defective memory block/column decoder pairs. For example, if memory block/column decoder pairs $MB_1$/$CD_1$ and $MB_0$/$CD_0$ are defective, then write routing control units $WRCU_{129}$–$WRCU_2$ are controlled to route the data values DQ[127:0], respectively, to column decoders $CD_{129}$–$CD_2$, respectively.

Figure 5:
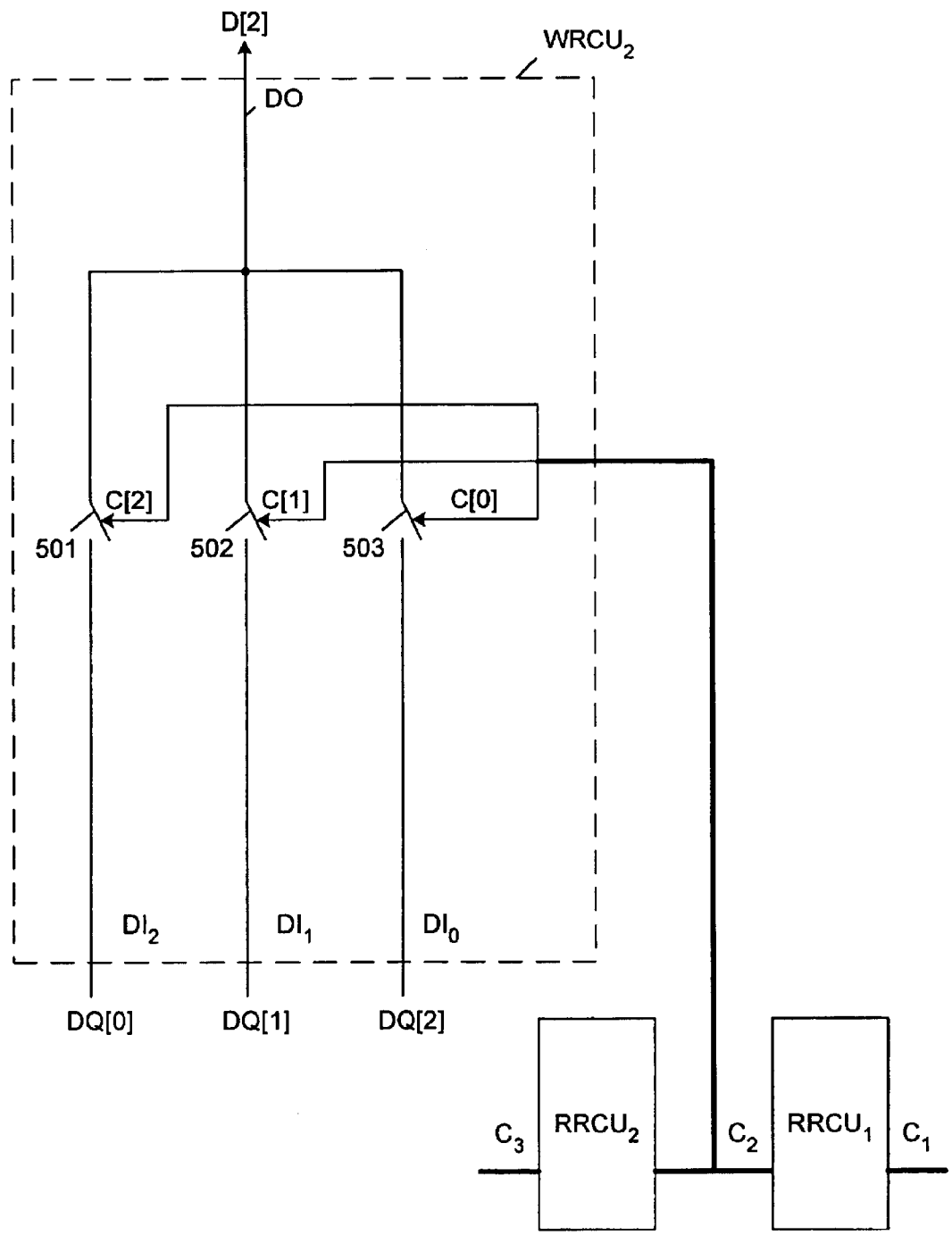
FIG. 5 is a schematic diagram of a write routing control unit in accordance with one embodiment of the present invention.

FIG. 5 is a schematic diagram of write routing control unit $WRCU_2$ in accordance with one embodiment of the present invention. Write routing control units $WRCU_{129}$–$WRCU_3$ and $WRCU_1$–$WRCU_0$ are identical to write routing control unit $WRCU_2$ in the described embodiment. Write routing control unit $WRCU_2$ includes switches 501, 502 and 503, which are coupled to receive data signals DQ[0], DQ[1] and DQ[2], respectively. Switches 501–503 are controlled by code signal C[2:0], as illustrated. The code signal C[2:0] received by write routing control unit $WRCU_2$ is provided by the code signal $C_2$ generated by read routing control unit $RRCU_1$. As described above, code signal $C_2$ is a control signal that identifies whether none, one or both of the two previous memory block/column decoder pairs ($MB_1$/$CD_1$ and $MB_0$/$CD_0$) is defective. The generation of code signal $C_2$ is described above in connection with FIG. 3.

In general, if the two previous memory block/column decoder pairs $MB_1$/$CD_1$ and $MB_0$/$CD_0$ are functional, then the code signals $C_2$ provided to write routing control unit $WRCU_2$ are equal to [0,0,$V_{DD}$]. Under these conditions, code signal $C_2$ turns on switch 503, thereby routing data value DQ[2] to column decoder $CD_2$ as data signal D[2].

If one of the two previous memory block/column decoder pairs ($MB_1$/$CD_1$ and $MB_0$/$CD_0$) is defective, then the code signals $C_2$ provided to write routing control unit $WRCU_2$ are equal to [0,$V_{DD}$,0]. Under these conditions, code signal $C_2$ turns on switch 502, thereby routing data value DQ[1] to column decoder $CD_2$ as data signal D[2]. This routing is appropriate because if one of the two previous memory block/column decoder pairs is defective, memory block $MB_2$ and column decoder $CD_2$ should process the data value DQ[1].

If both of the two previous memory block/column decoder pairs ($MB_1$/$CD_1$ and $MB_0$/$CD_0$) are defective, then the code signals $C_2$ provided to write routing control unit $WRCU_2$ are equal to [$V_{DD}$,0,0]. Under these conditions, code signal $C_2$ turns on switch 501, thereby routing data value DQ[0] to column decoder $CD_2$ as data signal D[2]. This routing is appropriate because if both of the two previous memory block/column decoder pairs are defective, memory block $MB_2$ and column decoder $CD_2$ should process the data value DQ[0].

The remainder of the write routing control units operate in the same manner as write routing control unit $WRCU_2$. Consequently, up to two defective memory block/column decoder pairs can be replaced using redundant memory blocks $MB_{129}$–$MB_{128}$ and redundant column decoders $CD_{129}$–$CD_{128}$. At most, data values DQ[127:0] are shifted to the left by two write routing control units. As a result, the delays in transmitting data values DQ[127:0] to column decoders $CD_{129}$–$CD_0$ are approximately equal, even under worst case routing conditions. That is, no routing paths are significantly longer than any other routing paths, regardless of which memory block/column decoder pairs are defective.

One embodiment of the present invention provides a byte write masking circuit that enables a device that is accessing memory system 200 to specify a write operation of fewer than 128 bits. The 128-bit width of data bus $DQ_{127}$–$DQ_0$ is logically divided into sixteen 8-bit bytes. As described in more detail below, a byte write masking circuit is provided for enabling write operations to any selected set of these sixteen bytes.

Figure 6:
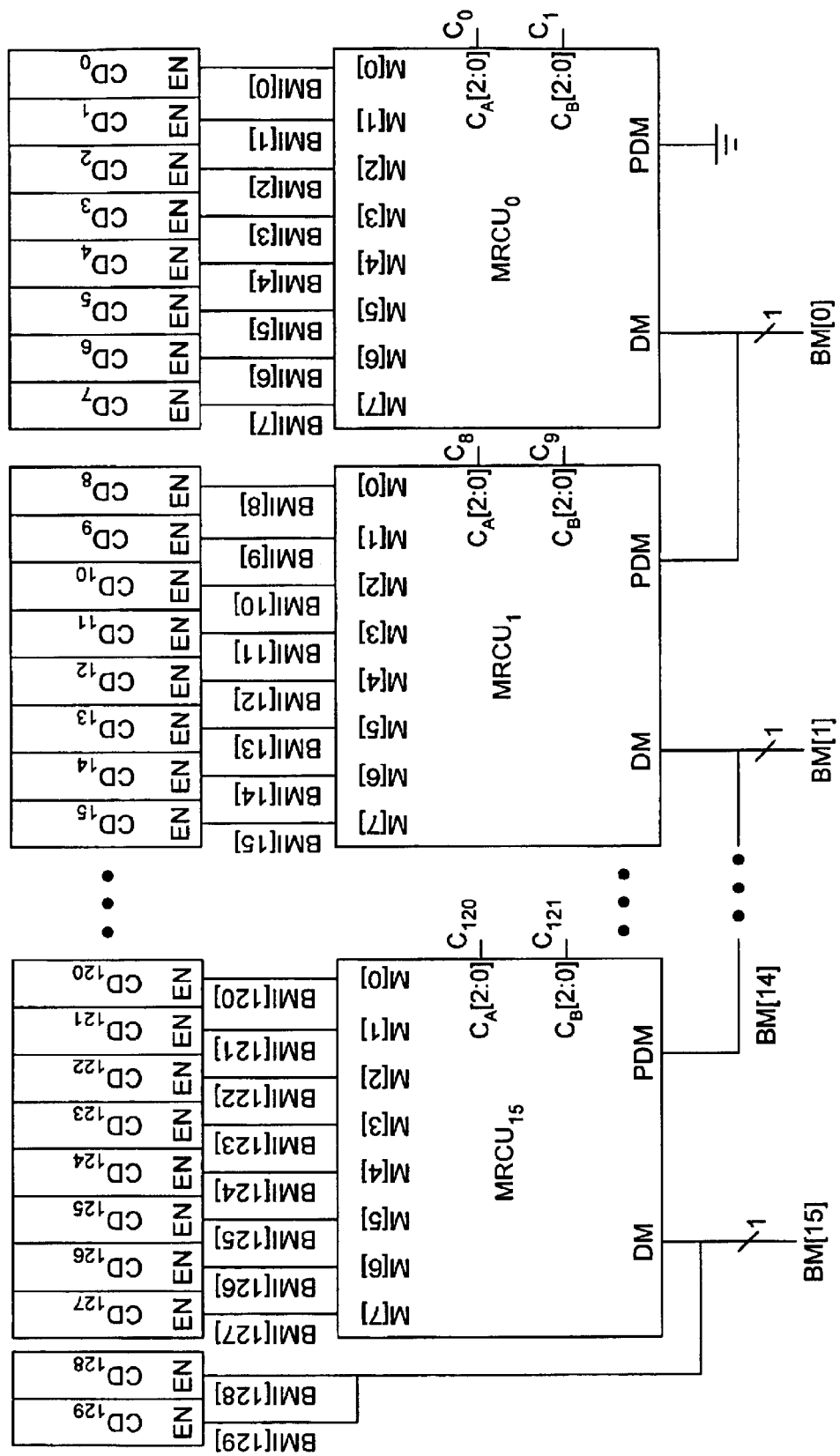
FIG. 6 is a block diagram of a byte write masking circuit in accordance with one embodiment of the present invention.

FIG. 6 is a block diagram of a byte write masking circuit 600 in accordance with one embodiment of the present invention. Byte write masking circuit 600 is designed for use with memory system 200. As described above in connection with FIGS. 4 and 5, write data bits may be shifted by up to two bit locations to enable the replacement of defective memory block/column decoder pairs. Byte mask bits must therefore be similarly shifted to provide correspondence between the write data bits and the byte mask bits. As described below, byte write masking circuit 600 provides the appropriate shifting of the byte mask bits.

Byte write masking circuit 600 includes sixteen mask routing control units $MRCU_{15}$–$MRCU_0$. Each of mask routing control units $MRCU_{15}$–$MRCU_0$ is coupled to receive a pair of byte mask bits. More specifically, mask routing control units $MRCU_{15}$–$MRCU_0$ are coupled to receive corresponding byte mask bits BM[15:0], respectively. Each of the sixteen byte mask bits BM[15:0] corresponds with one of the sixteen 8-bit bytes provided on data lines $DQ_{127}$–$DQ_0$. In addition, mask routing control units $MRCU_{15}$–$MRCU_1$ are coupled to receive byte mask bits BM[14:0], respectively, from previous mask routing control units, and mask routing control unit $MRCU_0$ is coupled to receive a logic "0" byte mask bit (i.e., ground).

Each of mask routing control units $MRCU_{15}$–$MRCU_0$ is also coupled to receive a pair of code signals. Mask routing control units $MRCU_{15}$–$MRCU_0$ selectively route the byte mask bits BM[15:0] in response to the applied code signals, thereby providing byte mask input bits BMI[129:0]. Byte mask input bits BMI[129:0] are provided to enable terminals of column decoders $CD_{129}$–$CD_0$, respectively. A byte mask input bit having a logic low value enables the corresponding column decoder, such that write data is transmitted through the column decoder. Conversely, a byte mask input bit having a logic high value disables the corresponding column decoder, such that write data is prevented from passing through the column decoder.

In general, if none of memory blocks $MB_{127}$–$MB_0$ or column decoders $CD_{127}$–$CD_0$ is defective, then the byte mask bits BM[15:0] are routed directly through mask routing control units $MRCU_{15}$–$MRCU_0$, respectively. For example, byte mask bit BM[0] is routed through mask routing control unit $MRCU_0$ as byte mask input values BMI[7:0], byte mask bit BM[1] is routed through mask routing control unit $MRCU_1$ as byte mask input values BMI[15:8], and byte mask bit BM[15] is routed through mask routing control unit $MRCU_{15}$ as byte mask input values BMI[127:120].

If there is one defective memory block/column decoder pair located in mask routing control unit $MRCU_N$, then each set of eight byte mask input values are shifted to the left by one bit location, beginning in mask routing control unit $MRCU_{N+1}$. For example, if one of the memory block/column decoder pairs associated with mask routing control unit $MRCU_0$ is defective, then mask routing control unit $MRCU_1$ will route the byte mask bit BM[0] as byte mask input bit BMI[8]. As a result, the set of eight byte mask input values BMI[7:0] is effectively shifted one bit to the left. In this example, each of the other mask routing control units $MRCU_{15}$–$MRCU_2$ is controlled in a similar manner to provide one bit shift to the left. For example, mask routing control circuit $MRCU_2$ will route the byte mask bit BM[1] as byte mask input bit BMI[16], and mask routing control circuit $MRCU_{15}$ will route the byte mask bit BM[14] as byte mask input bit BMI[120].

If there are two defective memory block/column decoder pairs located to the right of mask routing control unit $MRCU_N$, then each set of eight byte mask input values are shifted to the left by two bit locations, beginning in mask routing control unit $MRCU_N$. For example, if two of the memory block/column decoder pairs associated with mask routing control unit $MRCU_0$ are defective, then mask routing control unit $MRCU_1$ will route the byte mask bit BM[0] as byte mask input bit BMI[8] and as byte mask input bit BMI[9]. As a result, the set of eight byte mask input values BMI[7:0] is effectively shifted two bits to the left. In this example, each of the other mask routing control units $MRCU_{15}$–$MRCU_2$ is controlled in a similar manner to provide a two bit shift to the left. For example, mask routing control circuit $MRCU_2$ will route the byte mask bit BM[1] as byte mask input bits BMI[16] and BMI[17], and mask routing control circuit $MRCU_{15}$ will route the byte mask bit BM[14] as byte mask input bits BMI[120] and BMI[121].

Figure 7:
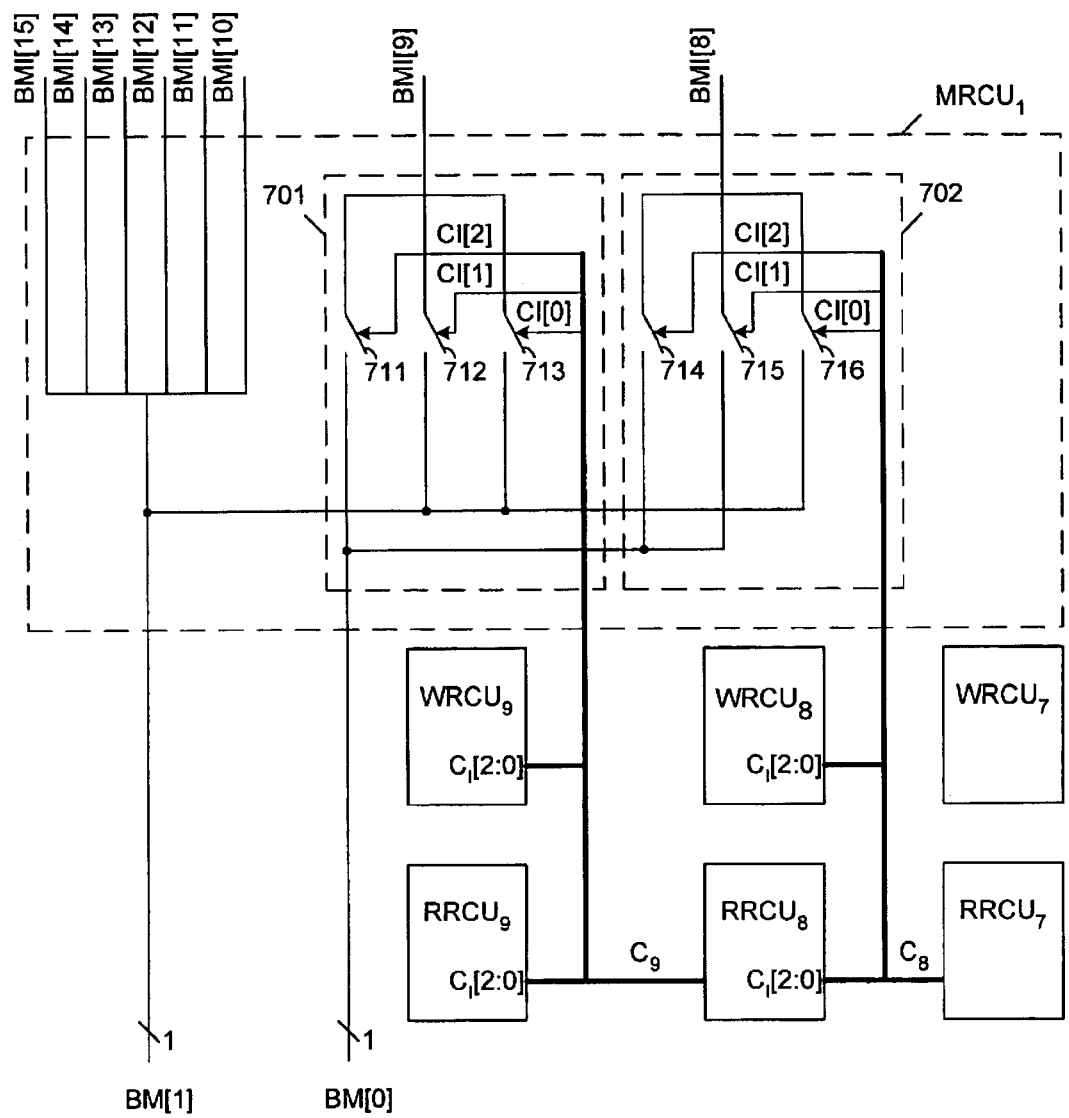
FIG. 7 is a schematic diagram of a mask routing control unit in accordance with one embodiment of the present invention.

FIG. 7 is a schematic diagram of mask routing control unit $MRCU_1$ in accordance with one embodiment of the present invention. Mask routing control unit $MRCU_1$ includes switch circuits 701 and 702, which include switches 711–713 and 714–716, respectively. In the described embodiment, mask routing control units $MRCU_{15}$–$MRCU_2$ and $MRCU_0$ are identical mask routing control unit $MRCU_1$. (Note that within mask routing control unit $MRCU_0$, the switches corresponding to switches 701 and 702 will always route byte mask bit BM[0] as byte mask input bits BMI[1] and BMI[0]). FIG. 7 also illustrates read routing control units $RRCU_9$–$RRCU_7$ and write routing control units $WRCU_9$–$WRCU_7$.

As illustrated in FIG. 7, byte mask bit BM[1] is always routed to provide the six most significant byte mask input bits BMI[15:10]. The two least significant byte mask input bits BMI[9:8] are provided by switching circuits 701 and 702, respectively. Within switching circuit 701, switch 711 is connected to receive byte mask bit BM[0], while switches 712 and 713 are connected to receive byte mask bit BM[1]. Switches 711, 712 and 713 are controlled by the code signal $C_9$, which is provided by read routing control unit $RRCU_8$ in the manner described above in connection with FIGS. 2 and 3. Within switching circuit 702, switches 714 and 715 are connected to receive byte mask bit BM[0], while switch 716 is connected to receive byte mask bit BM[1]. Switches 714, 715 and 716 are controlled by the code signal $C_8$, which is provided by read routing control unit $RRCU_7$ in the manner described above in connection with FIGS. 2 and 3.

As described above, code signal $C_8$ will have a value of $[0,0,V_{DD}]$ if all of memory blocks $MB_7$–$MB_0$ and column decoders $CD_7$–$CD_0$ are functional. In this case, byte mask bit BM[1] is routed through switch 716 as byte mask input bit BMI[8] (i.e., no shift is performed). This routing is appropriate because if none of memory blocks $MB_7$–$MB_0$ is defective, then the 8-bit data byte associated with memory blocks $MB_7$–$MB_0$ will actually be written to these memory blocks $MB_7$–$MB_0$.

Code signal $C_8$ will have a value of $[0,V_{DD},0]$ if one of the memory block/column decoder pairs comprised by memory blocks $MB_7$–$MB_0$ and column decoders $CD_7$–$CD_0$ is defective. In this case, byte mask bit BM[0] is routed through switch 715 as byte mask input bit BMI[8]. In this case, a 1-bit shift is performed. This routing is appropriate because if only one of memory blocks $MB_7$–$MB_0$ is defective, then the 8-bit data byte that would normally be written to memory blocks $MB_7$–$MB_0$ will now be written to the seven non-defective memory blocks in the group of memory blocks $MB_7$–$MB_0$, plus memory block $MB_8$.

Finally, code signal $C_8$ will have a value of $[V_{DD},0,0]$ if two of the memory block/column decoder pairs comprised by memory blocks $MB_7$–$MB_0$ and column decoders $CD_7$–$CD_0$ are defective. In this case, byte mask bit BM[0] is routed through switch 714 as byte mask input bit BMI[9]. As will become evident in view of the discussion of switch 701, this operation is part of a 2-bit shift.

Turning now to switch 701, code signal $C_9$ will have a value of $[0,0,V_{DD}]$ if all of memory blocks $MB_8$–$MB_0$ and column decoders $CD_8$–$CD_0$ are functional. In this case, byte mask bit BM[1] is routed through switch 713 as byte mask input bit BMI[9] (i.e., no shift is performed). This routing is appropriate because if none of memory blocks $MB_8$–$MB_0$ is defective, then the 8-bit data byte associated with memory blocks $MB_7$–$MB_0$ will actually be written to these memory blocks $MB_7$–$MB_0$.

Code signal $C_9$ will have a value of $[0,V_{DD},0]$ if one of the memory block/column decoder pairs comprised by memory blocks $MB_8$–$MB_0$ and column decoders $CD_8$–$CD_0$ is defective. In this case, byte mask bit BM[1] is routed through switch 712 as byte mask input bit BMI[9] (i.e., no shift is performed). This routing is appropriate because if only one of memory blocks $MB_8$–$MB_0$ is defective, then the 8-bit data byte that would normally be written to memory blocks $MB_7$–$MB_0$ will now be written to the eight non-defective memory blocks in the group of memory blocks $MB_8$–$MB_0$.

Finally, code signal $C_9$ will have a value of $[V_{DD},0,0]$ if two of the memory block/column decoder pairs comprised by memory blocks $MB_8$–$MB_0$ and column decoders $CD_8$–$CD_0$ are defective. In this case, byte mask bit BM[0] is routed through switch 711 as byte mask input bit BMI[9] (i.e., a 2-bit shift is performed). This routing is appropriate because if two of memory blocks $MB_8$–$MB_0$ are defective, then the 8-bit data byte that would normally be written to memory blocks $MB_7$–$MB_0$ will now be written to the eight non-defective memory blocks in the group of memory blocks $MB_9$–$MB_0$.

In another embodiment of the present invention, the above-described circuitry is modified to provide bank enable signals to a plurality of memory banks.

Figure 8:
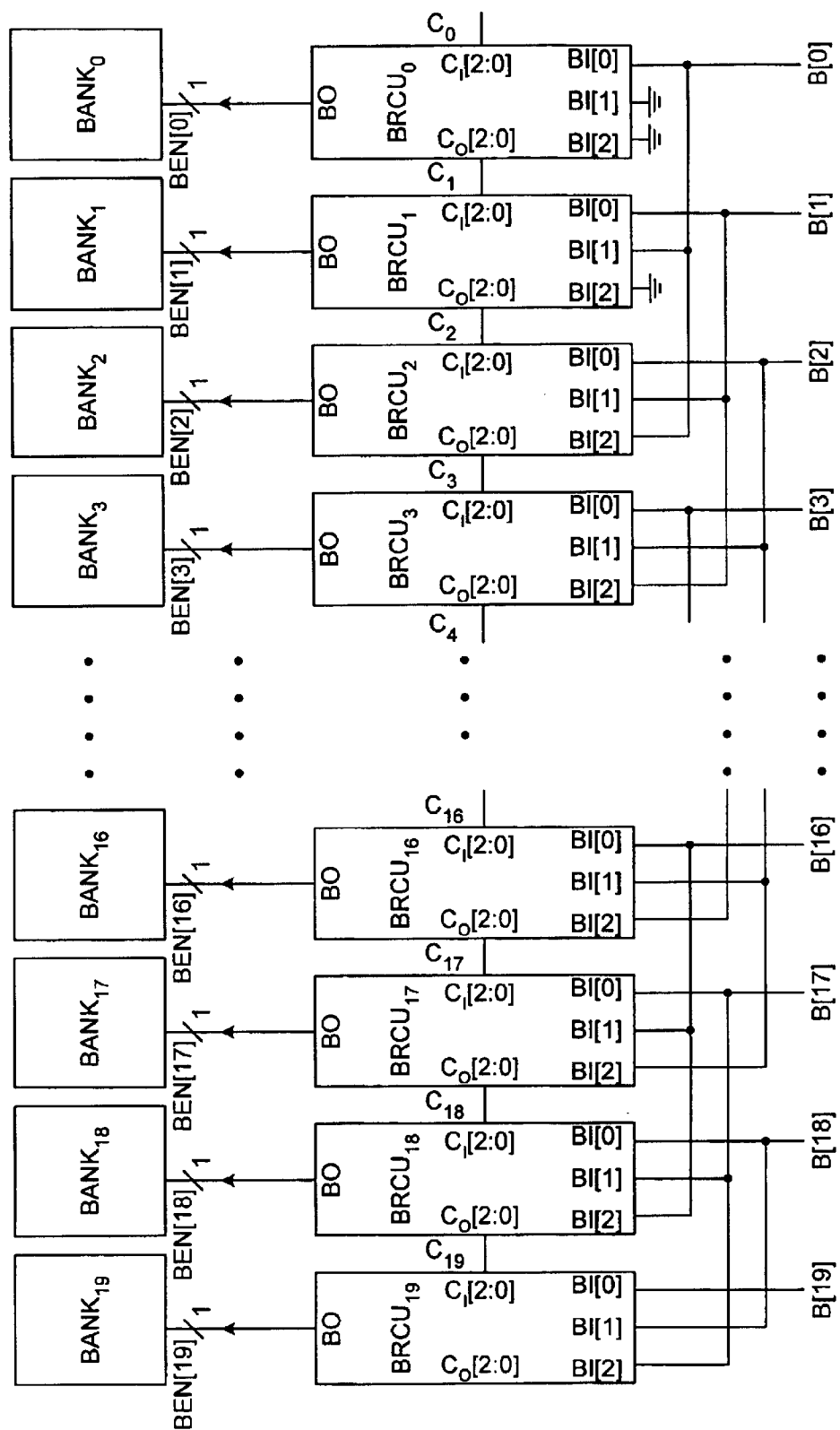
FIG. 8 is a block diagram of a memory system that implements a bank redundancy scheme in accordance with one embodiment of the present invention.

FIG. 8 is a block diagram of a memory system 800 that includes plurality of memory banks $BANK_{19}$–$BANK_0$. These memory banks $BANK_{19}$–$BANK_0$ are enabled (and disabled) by bank enable signals BEN[19]–BEN[0], respectively. A logic high bank enable signal enables the corresponding bank, and a logic low bank enable signal disables the corresponding bank.

Bank enable signals BEN[19]–BEN[0] are provided by bank routing control units $BRCU_{19}$–$BRCU_0$, respectively.

Each of bank routing control units $BRCU_N$ is coupled to receive bank enable signals $B[N]$, $B[N-1]$ and $B[N-2]$, where N is greater than 1. Bank routing control unit $BRCU_1$ is coupled to receive bank enable signals $B[1]$, $B[0]$ and a logic '0' signal. Bank routing control unit $BRCU_0$ is coupled to receive bank enable signal $B[0]$ and a pair of logic '0' signals. Each of bank routing control units $BRCU_{19}$–$BRCU_0$ is controlled to route one of its three input signals as a corresponding bank enable signal $BEN_{19}$–$BEN_0$ in response to an applied code signal $C_i[2:0]$.

Figure 9:
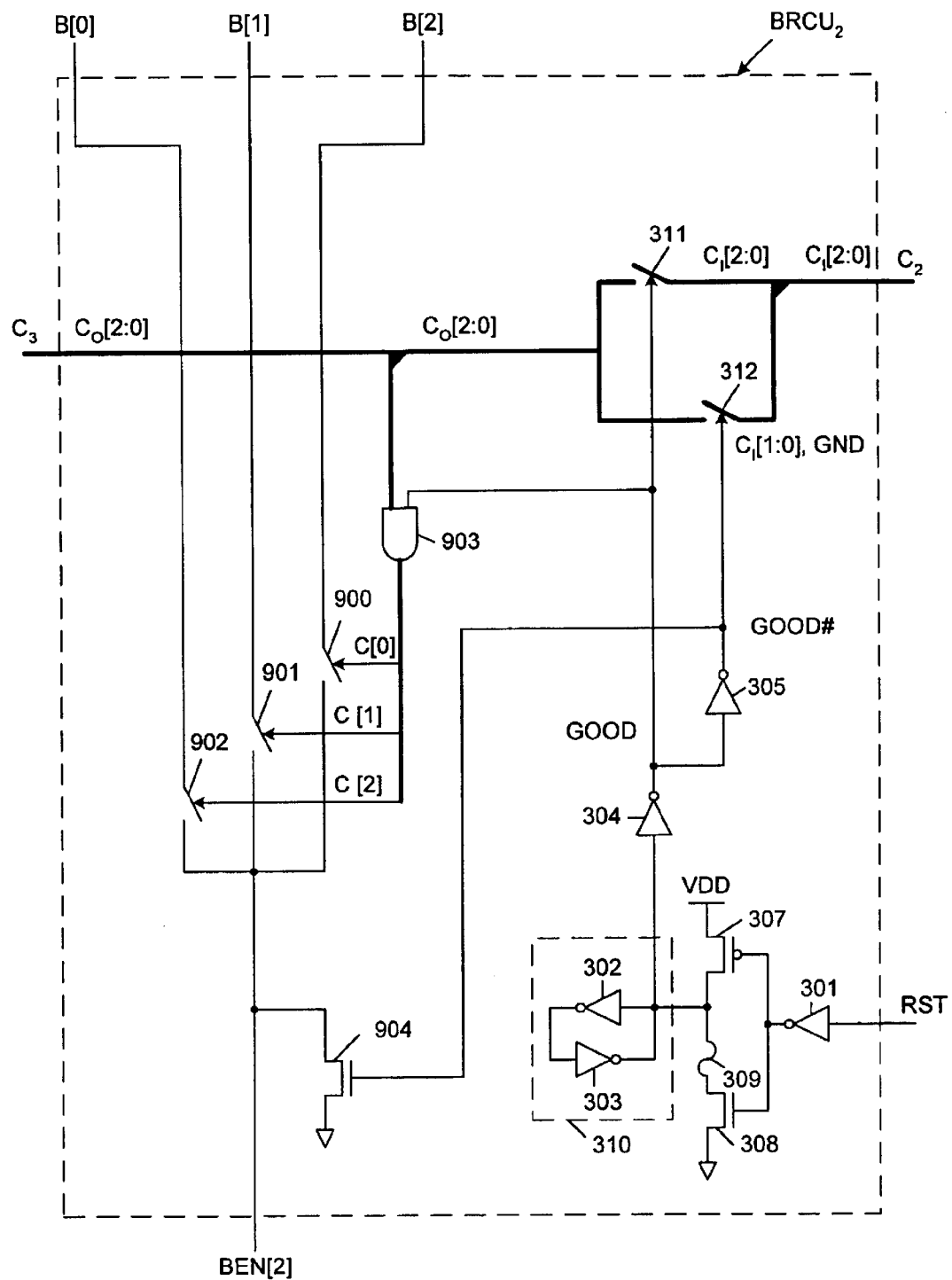
FIG. 9 is a schematic diagram of a bank routing control unit in accordance with one embodiment of the present invention.

FIG. 9 is a schematic diagram of bank routing control unit $BRCU_2$ in accordance with one embodiment of the present invention. In the described embodiment, bank routing control units $BRCU_{19}$–$BRCU_3$ and $BRCU_1$–$BRCU_0$ are identical to bank routing control unit $BRCU_2$. Bank routing control unit $BRCU_2$ includes inverters 301–305, p-channel transistor 307, n-channel transistor 308, fuse 309 and switches 311–312. These elements were previously described in connection with FIG. 3, and will therefore not be described in detail again. In general, fuse 309 is blown if the corresponding bank $BANK_2$ is defective, and is not blown if the corresponding bank $BANK_2$ is functional. At start-up, the reset signal RST is initially asserted high and then de-asserted low. If bank $BANK_2$ is functional, then inverter 304 will provide a logic high GOOD control signal that closes switch 311. Conversely, if bank $BANK_2$ is defective, then inverter 305 will provide a logic high GOOD# control signal that closes switch 312. Switches 311 and 312 pass the applied code signal $C_2$ in the manner described above in connection with FIG. 3. (Note that bank routing control unit $BRCU_0$ receives an initial code signal $C_0$ having a value of $[0,0,V_{DD}]$.)

The GOOD control signal is also applied to an input terminal of AND gate 903. The other input terminals of AND gate 903 are coupled to receive the code signal $C_O[2:0]$. If the GOOD control signal has a logic high value (i.e., $BANK_2$ is functional), then the output code signals $C_O[2:0]$ are routed through AND gate 903 to control switches 900–902, respectively. As described above, the code signals $C_O[2:0]$ will have a value of $[0,0,V_{DD}]$ if none of the memory banks $BANK_2$–$BANK_0$ is defective, a value of $[0,V_{DD},0]$ if one of the memory banks $BANK_2$–$BANK_0$ is defective, and a value of $[V_{DD},0,0]$ if two of the memory banks $BANK_2$–$BANK_0$ are defective. Accordingly, if none of the memory banks $BANK_2$–$BANK_0$ is defective, then switch 900 is enabled, thereby routing bank enable signal $B[2]$ to bank $BANK_2$ as the bank enable signal $BEN[2]$. If one of the memory banks $BANK_2$–$BANK_0$ is defective, then switch 901 is enabled, thereby routing bank enable signal $B[1]$ to bank $BANK_2$ as the bank enable signal $BEN[2]$. Finally, if two of the memory banks $BANK_2$–$BANK_0$ are defective, then switch 902 is enabled, thereby routing bank enable signal $B[0]$ to bank $BANK_2$ as the bank enable signal $BEN[2]$. In this manner, the bank enable signals are appropriately shifted to avoid defective memory banks. Advantageously, the delays in routing the bank enable signals to the memory banks are substantially equivalent, regardless of which of the memory banks may be defective.

If memory bank $BANK_2$ itself is defective, then the GOOD control signal will have a logic low value, thereby causing AND gate 903 to provide logic low signals to disable all of switches 900–902. Under these conditions, the GOOD# control signal has a logic high value, which is provided to the gate of n-channel transistor 904, thereby turning on this transistor. Turned on transistor 904 couples the output terminal of bank routing control unit $BRCU_2$ to ground, thereby providing a logic low bank enable signal $BEN[2]$. Defective bank $BANK_2$ is thereby disabled.

Alternative Embodiment

Figure 10A:
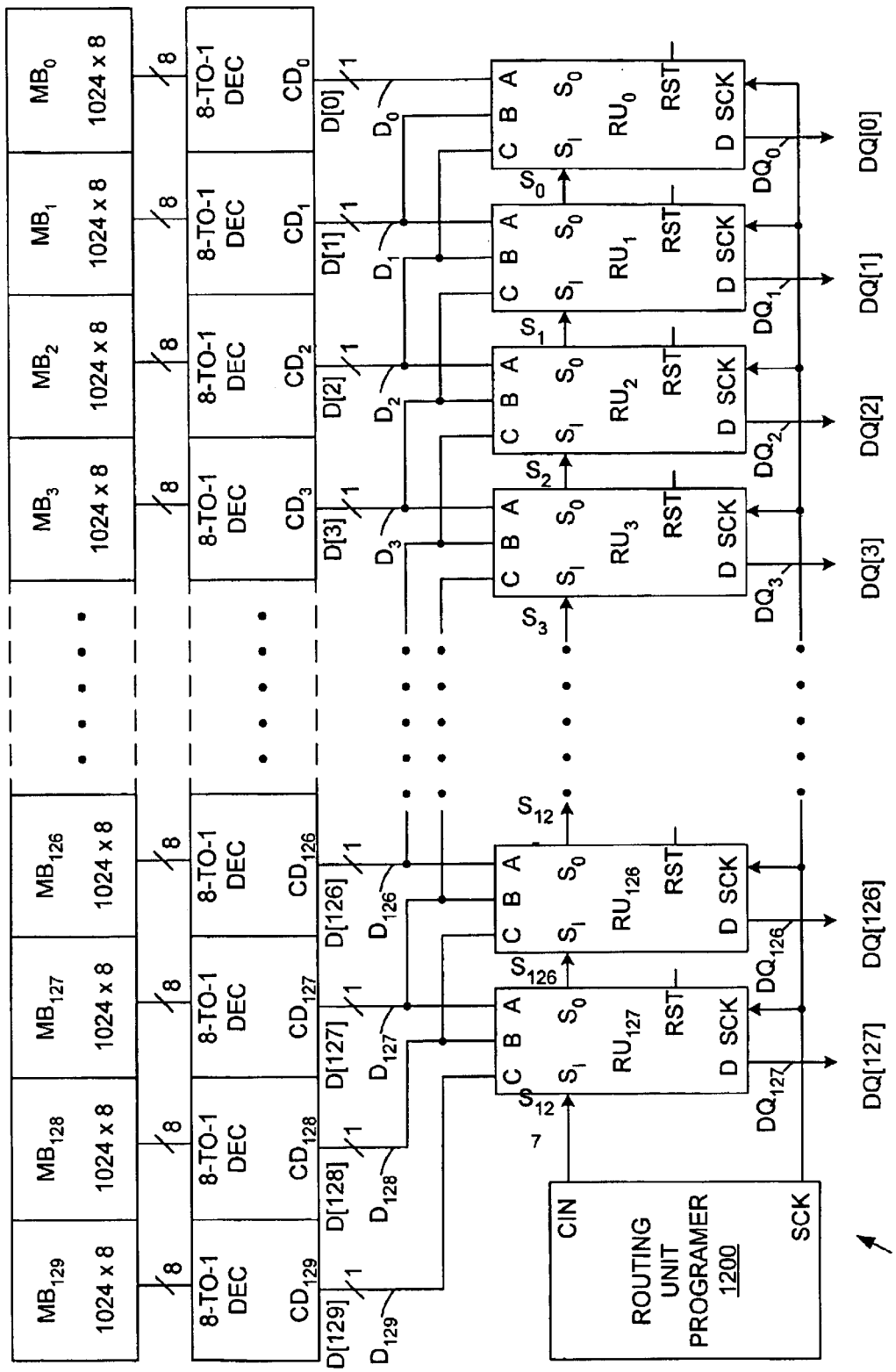
FIG. 10A is a block diagram of a memory system that implements a read and write redundancy scheme accordance with another embodiment of the present invention.

FIG. 10A is a block diagram of a memory system 1000 that implements a read and write redundancy scheme in accordance with another embodiment of the present invention. Similar elements in memory system 1000 and memory system 200 (FIG. 2) are labeled with similar reference numbers. Thus, memory system 1000 includes memory blocks $MB_{129}$–$MB_0$ and column decoders $CD_{129}$–$CD_0$. Memory system 1000 also includes read/write routing control units $RU_{127}$–$RU_0$, external data lines $DQ_{127}$–$DQ_0$, internal data lines $D_{129}$–$D_0$ and routing unit programmer 1300. In the described embodiment, column decoders $CD_{129}$–$CD_0$ include read-write circuitry, such as read data amplifiers and write drivers, thereby providing an interface between data lines $D_{129}$–$D_0$ and memory blocks $MB_{129}$–$MB_0$.

Each of the 128 read/write routing control units $RU_{127}$–$RU_0$ is coupled to a corresponding one of the 128 data lines $DQ_{127}$–$DQ_0$. Each of the 128 read/write routing control units $RU_{127}$–$RU_0$ is also coupled to a corresponding trio of consecutive column decoders $CD_{129}$–$CD_0$ (i.e., a corresponding trio of consecutive data lines $D_{129}$–$D_0$). More specifically, read/write routing control unit $RU_n$ is coupled to column decoders $CD_n$, $CD_{n+1}$, and $CD_{n+2}$ (or data lines $D_n$, $D_{n+1}$ and $D_{n+2}$), where n is an integer between 0 and 127. As described in more detail below, each read/write routing control unit $RU_n$ selectively couples one of its corresponding trio of column decoders $CD_n$, $CD_{n+1}$ $CD_{n+2}$ to its corresponding data line $DQ_n$ under the control of routing unit programmer 1200. In the described embodiment, routing units $RU_{127}$–$RU_0$ pass signals in a bi-directional manner between data lines $D_{129}$–$D_0$ and data lines $DQ_{127}$–$DQ_0$. The data values present on data lines $DQ_{127}$–$DQ_0$ are labeled as data values $DQ[127:0]$, respectively. The data values present on data lines $D_{129}$–$D_0$ are labeled as data values $D[129:0]$, respectively.

Figure 10B:
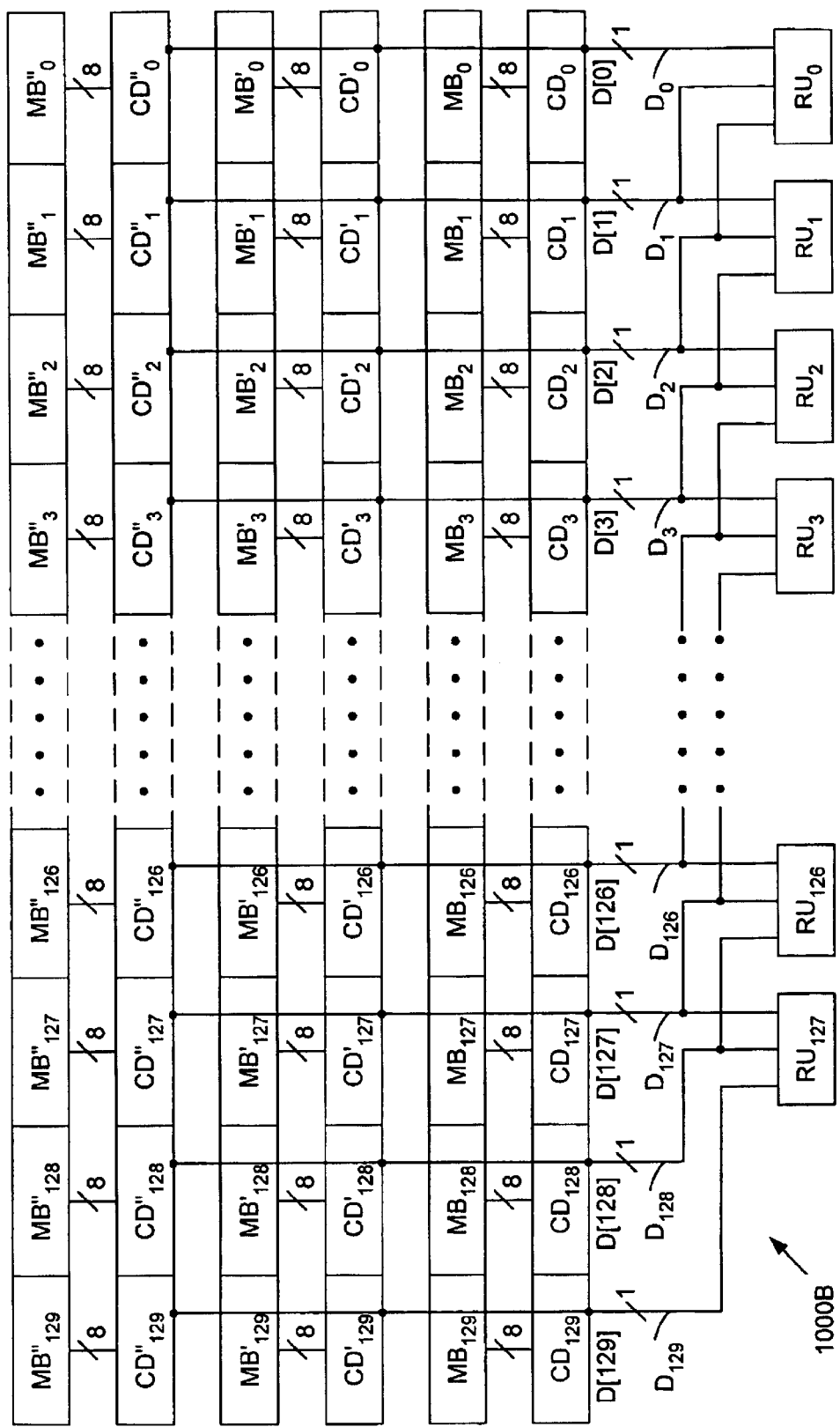
FIG. 10b is a block diagram of an expanded memory system that implements a read and write redundancy scheme accordance with another embodiment of the present invention.

Although the present embodiment is described in connection with a single row of memory block/column decoder pairs, it is understood that in other embodiments, multiple rows of memory block/column decoder pairs can be used. FIG. 10B illustrates a memory system 1000B having three rows of memory block/column decoder pairs. In addition to memory blocks $MB_{129}$–$MB_0$ and column decoders $CD_{129}$–$CD_0$, memory system 1000B includes memory blocks $MB'_{129}$–$MB'_0$, column decoders $CD'_{129}$–$CD'_0$, memory blocks $MB''_{129}$–$MB''_0$ and column decoders $CD'_{129}$–$CD'_0$. Within each column, the column decoders are connected to a global bit line. Each global bit line is coupled to a read data amplifier and a write driver circuit (not shown). The read amplifier and write driver circuit are coupled to the routing units.

Thus, the output terminals of column decoders $CD''_2$, $CD'_2$ and $CD_2$ are commonly connected to a global bit line (i.e., line $D_2$). If a defect exists in any one of the memory blocks or column decoders in a column, then the entire column can be replaced by configuring the routing units in the manner described in more detail below. For example, if there is a defect in any one of memory blocks $MB''_2$, $MB'_2$, $MB_2$ or column decoders $CD''_2$, $CD'_2$ and $CD_2$, then all of these elements can be replaced by coupling routing unit $RU_2$ to memory blocks $MB''_3$, $MB'_3$, $MB_3$ and column decoders $CD''_3$, $CD'_3$ and $CD_3$. In other embodiments, larger numbers of rows (e.g., 32 rows) of memory block/column decoder pairs can be used, thereby minimizing the percentage of layout area consumed by routing units $RU_{127}$–$RU_0$ and routing unit programmer 1200.

As described above, there are two more memory block/column decoder pairs than routing control units. The two additional memory block/column decoder pairs allow up to two defective memory block/column decoder pairs to be replaced. Although the present embodiment describes a scheme having two possible redundancies, more or less redundancy can be easily incorporated with minor modification to the present embodiment.

Construct of Routing Units

Figure 11:
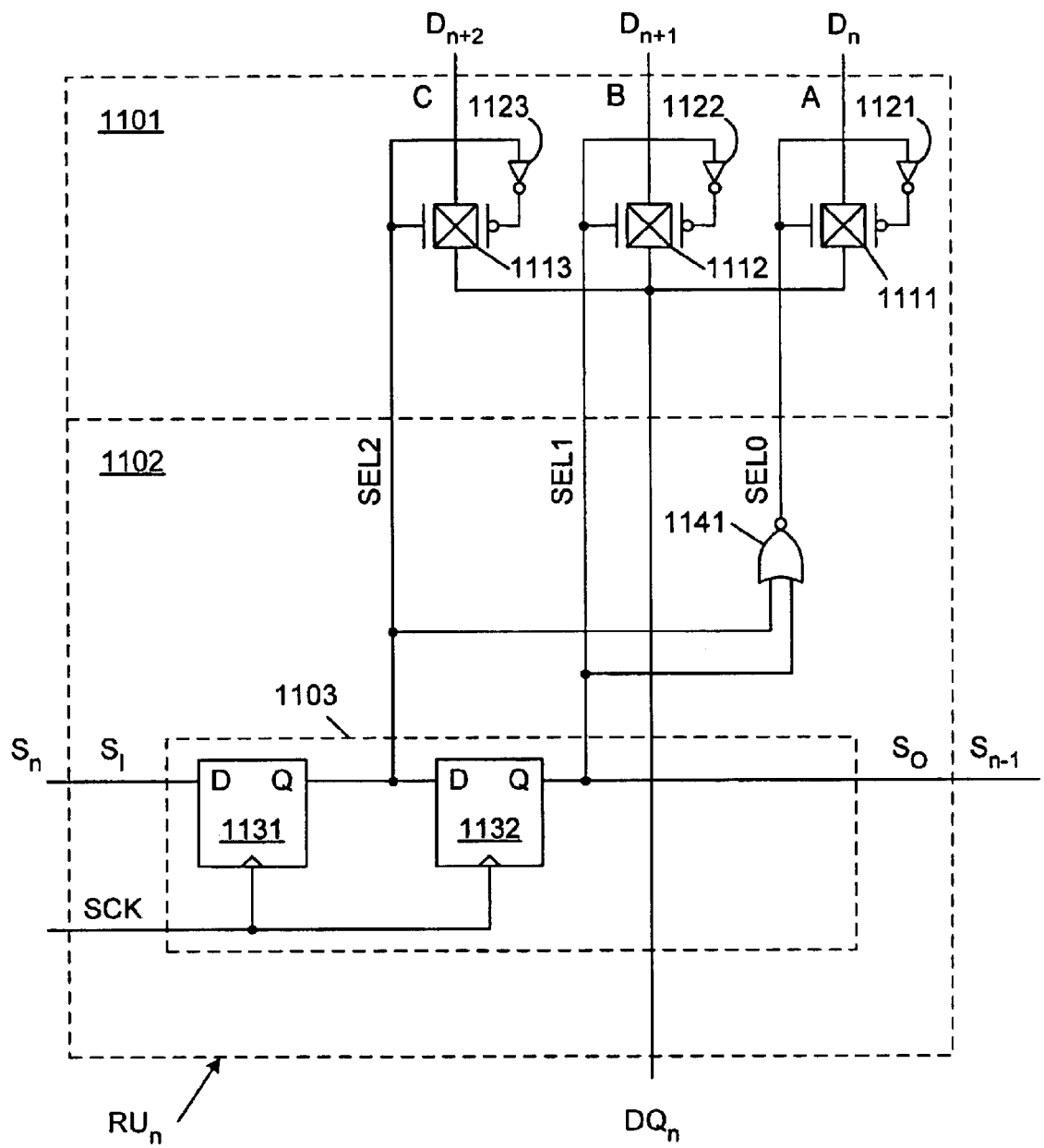
FIG. 11 is a circuit diagram of a read/write routing control unit used in a system having two redundant memory block/column decoder pairs.

FIG. 11 is a circuit diagram of a read/write routing control unit $RU_n$ in accordance with one embodiment of the present invention. Routing unit $RU_n$ includes router circuit 1101 and router controller 1102. Router circuit 1101 includes three transmission gates 1111, 1112 and 1113, which connect data lines $D_n$, $D_{n+1}$ and $D_{n+2}$, respectively, to data line $DQ_n$. Inverters 1121–1123 are coupled to transmission gates 1111–1113, respectively, as illustrated. Transmission gates 1111, 1112 and 1113 are controlled by select signals SEL0, SEL1 and SEL2, respectively, which are generated by router controller 1102.

Router controller 1102 includes D-Q flip-flops 1131–1132 and logical NOR gate 1141. The D input terminal of flip-flop 1131 is connected to receive the shift input signal $S_n$ at the shift input terminal $S_I$. The Q output terminal of flip-flop 1131 provides the SEL2 signal to transmission gate 1113, to NOR gate 1141, and to the D input terminal of flip-flop 1132. The Q output terminal of flip-flop 1132 provides the SEL1 signal to transmission gate 1112, to NOR gate 1141, and to the $S_O$ output terminal of routing unit $RU_n$. NOR gate 1141 provides the SEL0 signal to transmission gate 1111 in response to the SEL1 and SEL2 signals. The clock input terminals of flip-flops 1131 and 1132 are coupled to receive a scan clock signal (SCK) provided by routing unit programmer 1300.

As described in more detail below, flip-flops 1131–1132 will be programmed to store configuration values "10", "01" or "00" (configuration values "11" are not allowed). Table 1 below summarizes the states of the SEL0–SEL2 signals for the various configuration values stored in flip-flops 1131–1132. Note that in Table 1, the configuration values stored in flip-flops 1131 and 1132 are identified as $D_{1131}$ and $D_{1132}$, respectively.

TABLE 1

| $D_{1131}$ | $D_{1132}$ | SEL2 | SEL1 | SEL0 |
|---|---|---|---|---|
| 0 | 0 | 0 | 0 | 1 |
| 0 | 1 | 0 | 1 | 0 |
| 1 | 0 | 1 | 0 | 0 |

When the SEL0 signal is high, transmission gate 1111 is conducting (turned on), and transmission gates 1112 and 1113 are non-conducting (turned off). As a result, data line $D_n$ is connected to data line $DQ_n$.

When the SEL1 signal is high, transmission gate 1113 is turned on, and transmission gates 1111 and 1113 are turned off. As a result, data line $D_{n+1}$ is connected to data line $DQ_n$.

When the SEL2 signal is high, transmission gate 1113 is turned on, and transmission gates 1111 and 1112 are turned off. As a result, data line $D_{n+2}$ is connected to data line $DQ_n$.

Flip-flops 1131–1132 are serially connected to form a shifter circuit 1103. Thus, a value shifted into flip flop 1131 during one cycle of the SCK signal is shifted into flip flop 1132 during a subsequent cycle of the SCK signal. The input terminal $S_I$ of shifter circuit 1103 connected to the output terminal $S_O$ of the shifter circuit in the left-adjacent routing unit $RU_{n+1}$. Similarly, the output terminal $S_O$ of shifter circuit 1103 is connected to the input terminal SI of the shifter circuit in the right-adjacent routing unit $RU_{n-1}$. As a result, a 256-bit shift-chain circuit extending through routing units $RU_{127}$–$RU_0$ is formed. As illustrated in FIG. 10A, the $S_I$ input terminal of the shifter circuit in routing unit $RU_{127}$ is connected to receive the SIN signal provided by routing unit programmer 1300. As described in more detail below, routing unit programmer 1300 provides the data values to be shifted into routing units $RU_{127}$–$RU_0$ according to the defective/non-defective status of memory blocks $MB_{129}$–$MB_0$.

Repair Process

In the default mode, when none of memory blocks $MB_{127}$–$MB_0$ or column decoders $CD_{127}$–$CD_0$ is defective, routing units $RU_{127}$–$RU_0$ are configured such that data lines $D_{127}$–$D_0$ are connected to data lines $DQ_{127}$–$DQ_0$, respectively. As a result, the data signals D[127:0] are connected through routing units $RU_{127}$–$RU_0$ as data signals DQ[127:0]. That is, each of routing units $RU_{127}$–$RU_0$ passes the signal on its 'right' (A) terminal. In this case, the redundant memory blocks $MB_{129}$–$MB_{128}$ and redundant column decoders $CD_{129}$–$CD_{128}$ are not connected to any of data lines DQ[127:0].

If one memory block/column decoder pair is defective, then routing units $RU_{127}$–$RU_0$ are programmed to isolate the defective pair from data lines $DQ_{127}$–$DQ_0$. For example, if memory block $MB_n$, where n can be any number in the range of 0 to 127, is defective, then routing unit $RU_n$ is configured to connect data line $D_{n+1}$ to data line $DQ_n$. In addition, routing units $RU_{127}$–$RU_{n+1}$ are programmed to connect data lines $D_{128}$–$D_{n+2}$ to data lines $DQ_{127}$–$DQ_{n+1}$, respectively. In other words, each of routing units $RU_{127}$–$RU_n$ is configured to pass the signals on its 'middle' (B) terminal, while each of routing units $RU_{n-1}$–$R_0$ is configured to pass the signal on its 'right' (A) terminal. Stated another way, the routing position of each of routing units $RU_{127}$–$RU_n$ is shifted to the left by one position with respect to the default position.

To accomplish the routing described above, the shifter circuits 1103 in routing units $RU_{127}$ to $RU_n$ are programmed with a configuration value of "01", and the shifter circuits 1103 in routing units $RU_{n-1}$ to $RU_0$ are programmed with a configuration value of "00".

Assume that an additional memory block $MB_m$ or column decoder $CD_m$ is defective, where m is any number in the range of n+1 to 127. In this case, routing units $RU_{127}$–$RU_{m-1}$ are programmed to connect data lines $D_{129}$–$D_{m+1}$ to data lines $DQ_{127}$–$DQ_{m-1}$, respectively. That is, each of routing units $RU_{127}$–$RU_{m-1}$ is configured to pass the signal on its 'left' (C) terminal.

Routing units $RU_{m-2}$–$RU_n$ are programmed to connect data lines $D_{m-1}$–$D_{n+1}$ to data lines $DQ_{m-2}$–$DQ_n$. That is, each of routing units $RU_{m-2}$ to $RU_n$ is configured to pass the signal on its 'middle' (B) terminal.

Routing units $RU_{n-1}$ to $RU_0$ are programmed to connect data lines $D_{n-1}$ to $D_0$ to data lines $DQ_{n-1}$ to $DQ_0$. That is, each of routing units $RU_{n-1}$ to $RU_0$ is configured to pass the signal on its 'right' (A) terminal.

Stated another way, the routing position of each of routing units $RU_{127}$–$RU_{m-1}$ is shifted to the left by two positions with respect to the default position, the routing position of each of routing units $RU_{m-2}$–$RU_n$ is shifted to the left by one position with respect to the default position, and each of the routing units $RU_{n-1}$–$RU_0$ is not shifted with respect to the default position.

To accomplish the routing described above, the shifter circuits 1103 in routing units $RU_{127}$ to $RU_{m-1}$ are programmed with a configuration value of "10", the shifter circuits. 1103 in routing units $RU_{m-2}$ to $RU_n$ are programmed with a configuration value of "01", and the shifter circuits 1103 in routing units $RU_{n-1}$ to $RU_0$ are programmed with a configuration value of "00".

Scheme for More than Two Redundant Memory Blocks

Figure 12:
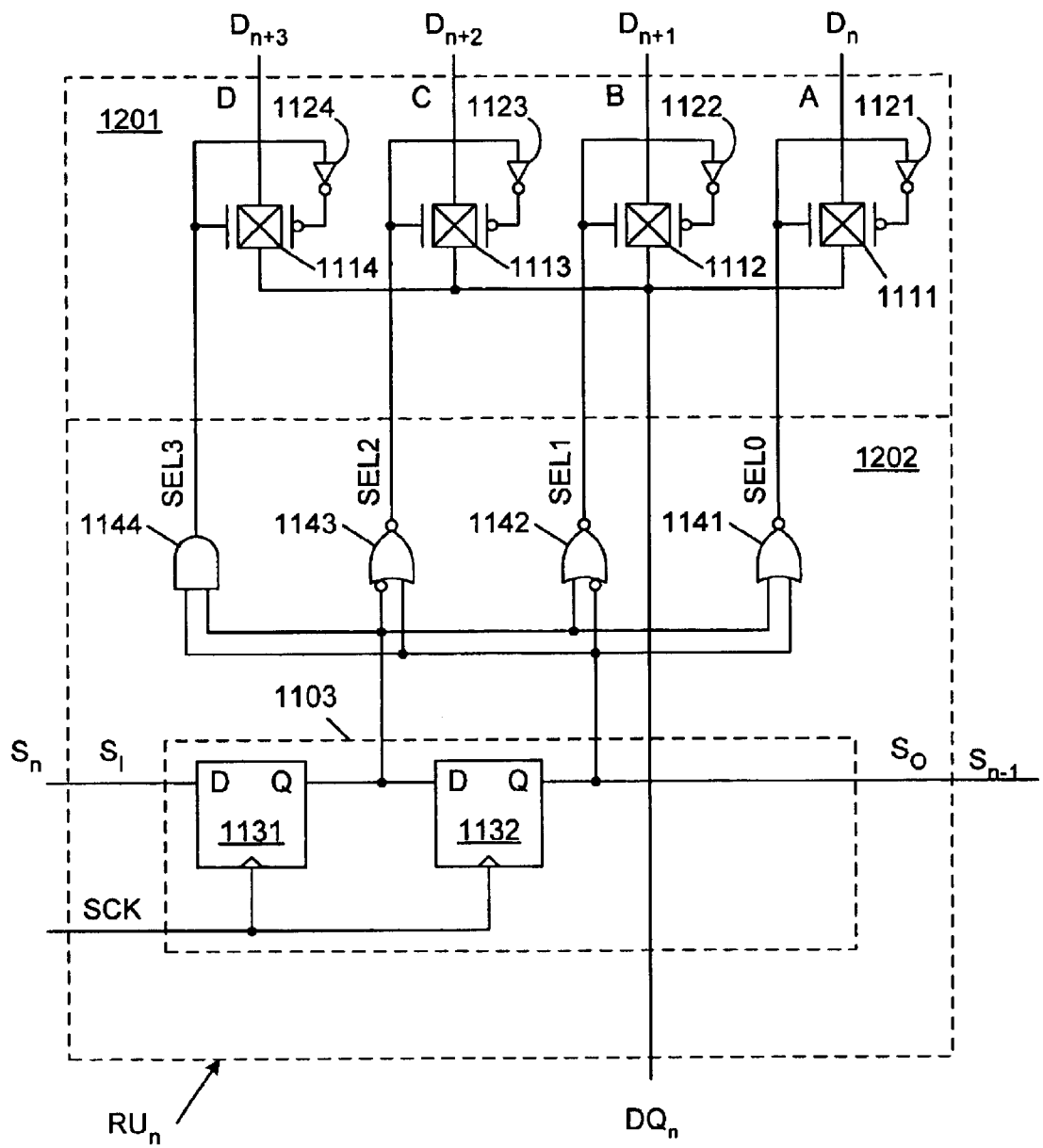
FIG. 12 is a circuit diagram of a routing unit that is used in a system having three redundant memory block/column decoder pairs.

The routing unit $RU_n$ of FIG. 11 can be readily modified for use in systems having a larger number of redundant elements. FIG. 12 is a circuit diagram of a routing unit $RU_n$ that is used in a system having three redundant memory block/column decoder pairs. Because the routing unit $RU_n$ of FIG. 12 is similar to the routing unit $RU_n$ of FIG. 11, similar elements are labeled with similar reference numbers in FIGS. 11 and 12. The routing unit $RU_n$ of FIG. 12 includes a router 1201 and a router controller 1202. Router 1201 includes four transmission gates 1111–1114 and four corresponding inverters 1121–1124. Transmission gates 1111, 1112, 1113 and 1114 are controlled by select signals SEL0, SEL1, SEL2 and SEL3, respectively. Router 1201 connects one of data lines $D_{n+3}$–$D_n$ to data line $DQ_n$ in response to the SEL[3:0] signals. Select signals SEL[3:0] are generated by logic gates 1141–1144 in response to the contents of flip-flops 1131 and 1132. Select signal SEL3 is generated using logical AND gate 1144, which has input terminals coupled to the Q output terminals of flip-flops 1131 and 1132. Select signal SEL2 is generated using logical NOR gate 1143, which has an inverting input terminal coupled to the Q output terminal of flip-flop 1131, and a non-inverting input terminal coupled to the Q output terminal of flip-flop 1132. Select signal SEL1 is generated using logical NOR gate 1142, which has a non-inverting input terminal coupled to the Q output terminal of flip-flop 1131, and an inverting input terminal coupled to the Q output terminal of flip-flop 1132. SEL1 and SEL2 signals. Select signal SEL0 is generated using logical NOR gate 1141, which is described above in connection with FIG. 11. Shifting circuit 1103 does not change in the embodiment of FIG. 12.

Table 2 below summarizes the states of the SEL[3:0] select signals for the various configuration values stored in flip-flops 1131–1132. Note that in Table 2, the configuration values stored in flip-flops 1131 and 1132 are identified as $D_{1131}$, and $D_{1132}$, respectively.

TABLE 2

| $D_{1131}$ | $D_{1132}$ | SEL3 | SEL2 | SEL1 | SEL0 |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

The routing unit $RU_n$ of FIG. 12 operates as follows to replace three defective memory blocks $MB_p$, $MB_m$ and $MB_n$, where n is less than m, and m is less than p. Shifters in routing units $RU_{p-2}$ and above are programmed with the value "11", shifters in routing units $RU_{p-3}$ to $RU_{m-1}$ are programmed with the value "10", shifters in routing units $RU_{m-2}$ to $RU_n$ are programmed with the value "01", and shifters in routing units $RU_{n-1}$ to $RU_0$ are programmed with the value of 00.

In general, for a system having k redundant memory blocks, the routing unit will include a router having "k" positions controlled by a shifter of "i" bits, where k equals to 2 to the power i (i.e., $k=2^i$). The shifter circuits of the routing units are connected to form a shift chain so that the flip flops in the shifter circuits can be programmed serially with a value of "j", where j has a value between 0 to k–1, assuming that the shifter has a default routing position of 0. To repair k defective memory blocks, shifters in routing units $RU_{x-j-1}$ to $RU_{y-p}$, between two defective memory blocks with locations x and y (x>y) are programmed with the value j, where j and p equal the number of defective blocks having an address less than x and y respectively.

For example, assume that there are seven redundant memory blocks (i.e., k=7), and seven defective memory blocks at locations 110, 100, 90, 80, 25, 10 and 4. Further assume that each of routing unit $RU_{127}$–$RU_0$ is able to shift by seven, six, five, four, three, two, one or zero locations in response to programmed j values of "111", "110", "101", "100", "011", "010", "001" and "000", respectively. In accordance with the equations above, the routing units $RU_{127}$–$RU_0$ are programmed to store j values according to Table 3 below.

TABLE 3

| J Value | Stored in Routing Units |
|---|---|
| 000 | $RU_3$–$RU_0$ |
| 001 | $RU_8$–$RU_4$ |
| 010 | $RU_{22}$–$RU_9$ |
| 011 | $RU_{76}$–$RU_{23}$ |
| 100 | $RU_{85}$–$RU_{77}$ |
| 101 | $RU_{94}$–$RU_{86}$ |
| 110 | $RU_{103}$–$RU_{95}$ |
| 111 | $RU_{127}$–$RU_{104}$ |

The routing units corresponding with a given j value are determined as set forth in the following example, which determines the routing units that receive the value of j="100" (i.e., binary "four"). In the present example, the defective memory block at location 90 has exactly four defective memory blocks at lower addresses. Thus, x=90 in the present example. The next (right-adjacent) defective memory block is present at location 80, and has exactly three defective memory blocks at lower addresses. Thus, y=80 and p=3 in the present example. As described above, the routing units storing a particular j value are defined by $RU_{x-j-1}$ to $RU_{y-p}$. In the present example, this becomes $RU_{(90-4-1)}$ to $RU_{(80-3)}$, or $RU_{85}$ to $RU_{77}$, which corresponds with the fifth entry of Table 3.

Shift-chain Programming

Figure 13:
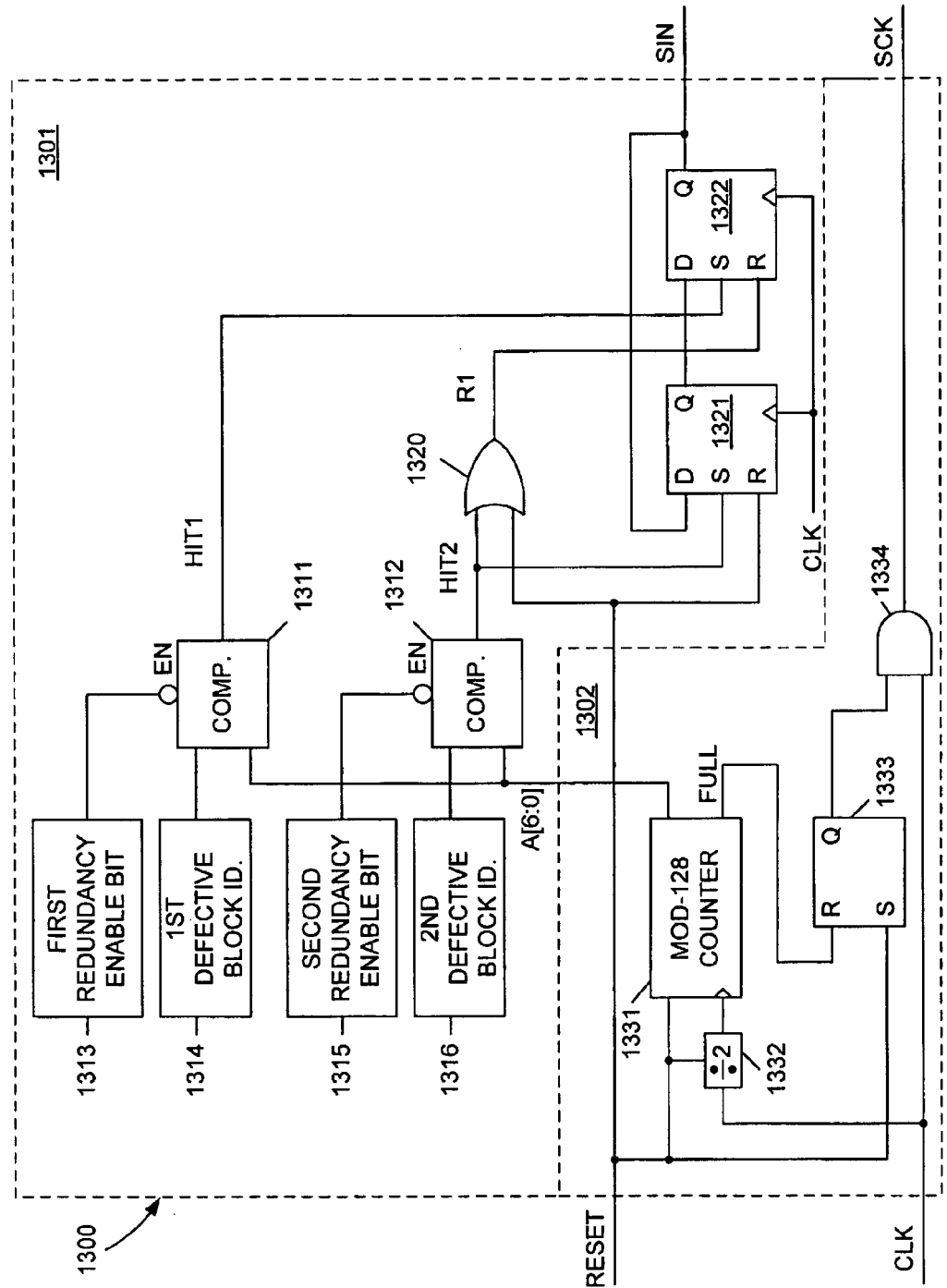
FIG. 13 is a block diagram of routing unit programmer for programming the shift chain of the routing units of FIG. 10A in accordance with one embodiment of the present invention.

FIG. 13 is a block diagram of routing unit programmer 1300 for programming the shift chain of routing units $RU_{127}$–$RU_0$ in accordance with one embodiment of the present invention. Routing unit programmer 1300 generates a configuration data input signal CIN, which is provided to routing unit $RU_{127}$ as the shift input signal $S_{127}$. This input signal CIN is sequentially shifted into the other routing units $RU_{126}$–$RU_0$. The propagation of the configuration data in the shift-chain is controlled by the shift clock signal SCK, which is also generated by routing unit programmer 1300. Routing unit programmer 1300 includes configuration data generator 1301 and sequencer 1302.

Configuration data generator 1301 includes comparators 1311–1312, non-volatile storage elements 1313–1316, OR gate 1320 and flip-flops 1321–1322. Non-volatile storage elements 1313–1316 can be constructed using, for example, fuses, anti-fuses, or EEPROM cells. Non-volatile storage elements 1313 and 1315 store first and second redundancy enable bits, respectively, which are used to enable or disable comparators 1311 and 1312, respectively. Non-volatile storage element 1314 stores the address of a first defective memory block. Non-volatile storage element 1316 stores an address which is one less than the address of a second defective memory block. For example, if memory blocks $MB_m$ and $MB_n$ are defective (where n is smaller than m), then non-volatile storage element 1314 is programmed with a value of n and non-volatile storage element 1316 is programmed with a value of m−1. The contents of storage elements 1314 and 1316 are provided to comparators 1311 and 1312, respectively.

Comparators 1311 and 1312 are also coupled to receive an address signal A[6:0] from modulo-128 counter 1331. When enabled, comparator 1311 provides a logic high HIT1 signal to the RESET terminal of flip flop 1322 when the contents of storage element 1314 match the address signal A[6:0]. Similarly, when enabled, comparator 1312 provides a logic high HIT2 signal to the SET terminal of flip flop 1321 and to an input terminal of OR gate 1320 when the contents of storage element 1316 match the address signal A[6:0]. A RESET signal is provided to OR gate 1320 and the RESET terminal of flip flop 1321. The output terminal of OR gate 1320 provides an R1 signal to the RESET input terminal of flip flop 1322. Flip-flops 1321 and 1322 are connected to form a circular queue, with the Q output terminal of flip flop 1321 connected to the D input terminal of flip flop 1322, and the Q output terminal of flip flop 1322 connected to the D input terminal of flip flop 1321. The circular queue stores a two-bit configuration value for programming two-bit shifter circuit 1103 in routing unit $RU_n$ (FIG. 11). As described in more detail below, the two-bit configuration value stored in flip flops 1321–1322 is controlled by the RESET signal, the HIT1 and HIT2 signals. Flip flops 1321 and 1322 are clocked by a system clock signal, CLK. However, flip flops 1321 and 1322 can be asynchronously set or reset through their RESET and SET input terminals. The Q output terminal of flip flop 1322 provides the CIN signal.

Sequencer 1302 includes modulo-128 counter 1331, prescalar circuit 1332, RS flip-flop 1333 and AND gate 1334. Modulo-128 counter 1331, prescalar circuit 1332 and the SET terminal of RS flip-flop 1333 are coupled to receive the RESET signal. Prescalar circuit 1332 receives the system clock signal CLK, and in response provides a divided clock signal to modulo-128 counter 1331. In response, modulo-128 counter provides a 7-bit address signal A[6:0] and a FULL signal, which is asserted high when the A[6:0] signal has all logic "1" values. The FULL signal is provided to the RESET terminal of flip flop 1333. The Q output terminal of flip flop 1333 is provided to an input terminal of AND gate 1334. The SCK signal is provided at the output terminal of AND gate 1334. The SCK signal is enabled by the Q output signal of R-S flip-flop 1333, which is driven high when the RESET signal is asserted high, and is driven low when a full-count is reached in the modulo-128 counter.

Address signal A[6:0] identifies the location of the routing unit on the shift chain to which the configuration input signal CIN is to be transmitted. A modulo-128 counter is required because there are 128 routing units $RU_{127}$–$RU_0$ used in the present embodiment. Because each routing unit $RU_n$ includes a 2-bit shifter circuit 1103, prescalar circuit 1332 divides the system clock signal CLK by two in order to distinguish the two locations in each shifter circuit 1103.

Circuit 1300 operates as follows. In the present example, there are two defective memory blocks $MB_m$ and $MB_n$ (m>n). Thus, storage elements 1313 and 1315 are programmed to store logic low values, thereby enabling comparators 1311 and 1312. Storage elements 1314 and 1316 are programmed to store the values n and m−1, respectively. At the beginning of the programming operation, the RESET signal is driven high, thereby resetting outputs of modulo-128 counter 1331, prescalar circuit 1332, and flip flops 1321–1322 to logic "0" values. However, R-S flip-flop 1333 is set to provide a logic high output signal in response to the logic high RESET signal. The high output signal provided by flip-flop 1333 enables the SCK signal to be generated in response to the CLK signal. Modulo-128 counter 1331 increments address signal A[6:0] once every two cycles of the CLK signal.

Before address signal A[6:0] reaches n, the HIT1, HIT2, RESET and R1 signals are all driven low. Consequently, output of flip flops 1321–1322 remain at logic "0" values. Shifter circuits 1103 in routing units $RU_{n-1}$–$RU_0$ will thereby be programmed to store a value of "00". When address A[6:0] is equal to n, comparator 1311 drives the HIT1 signal to a logic high state, but comparator 1312 continues to drive the HIT2 signal to a logic low state. The high state of the HIT1 signal sets the output signal of flip flop 1322 to a logic high state. As a result, the circular queue is loaded with the value "01". Starting from address n, the shifter circuits 1103 at addresses n and greater are programmed to store a configuration value of "01". This continues until address signal A[6:0] reaches a count of m−1. At this time, comparator 1312 drives the HIT2 signal to a logic high state. Note that when address signal A[6:0] is equal to n, the HIT1 signal is driven low. The high state of the HIT2 signal causes the R1 signal to be driven high by OR gate 1320. The high states of the HIT2 and R1 signals changes the output signals of flip flops 1321 and 1322 to "1" and "0", respectively. As a result, shifter circuits 1103 in routing units $RU_{127}$ to $RU_{m-1}$, are programmed to store a configuration value of "10".

When modulo-128 counter 1331 reaches its full count of 127, the FULL output signal is driven high, thereby resetting the output of R-S flip-flop 1333 to a logic low state, which in turn drives the shift clock signal SCK low, terminating the routing unit programming operation. The SCK signal remains low until the RESET signal is asserted high.

If there is only one defective memory block, then storage element 1315 is programmed with a logic high value, thereby disabling comparator 1312.

If there are no defective memory blocks, then storage elements 1313 and 1315 are both programmed with a logic high value, thereby disabling both of comparators 1311 and 1312.

Although the described routing unit programmer 1300 provides configuration values for a memory system having two redundant memory blocks, routing unit programmer 1300 can be easily modified by one skilled in the art to provide configuration values for memory systems having any other number of redundant memory blocks in view of the above disclosure.

Separate Read and Write Data Path

Figure 14:
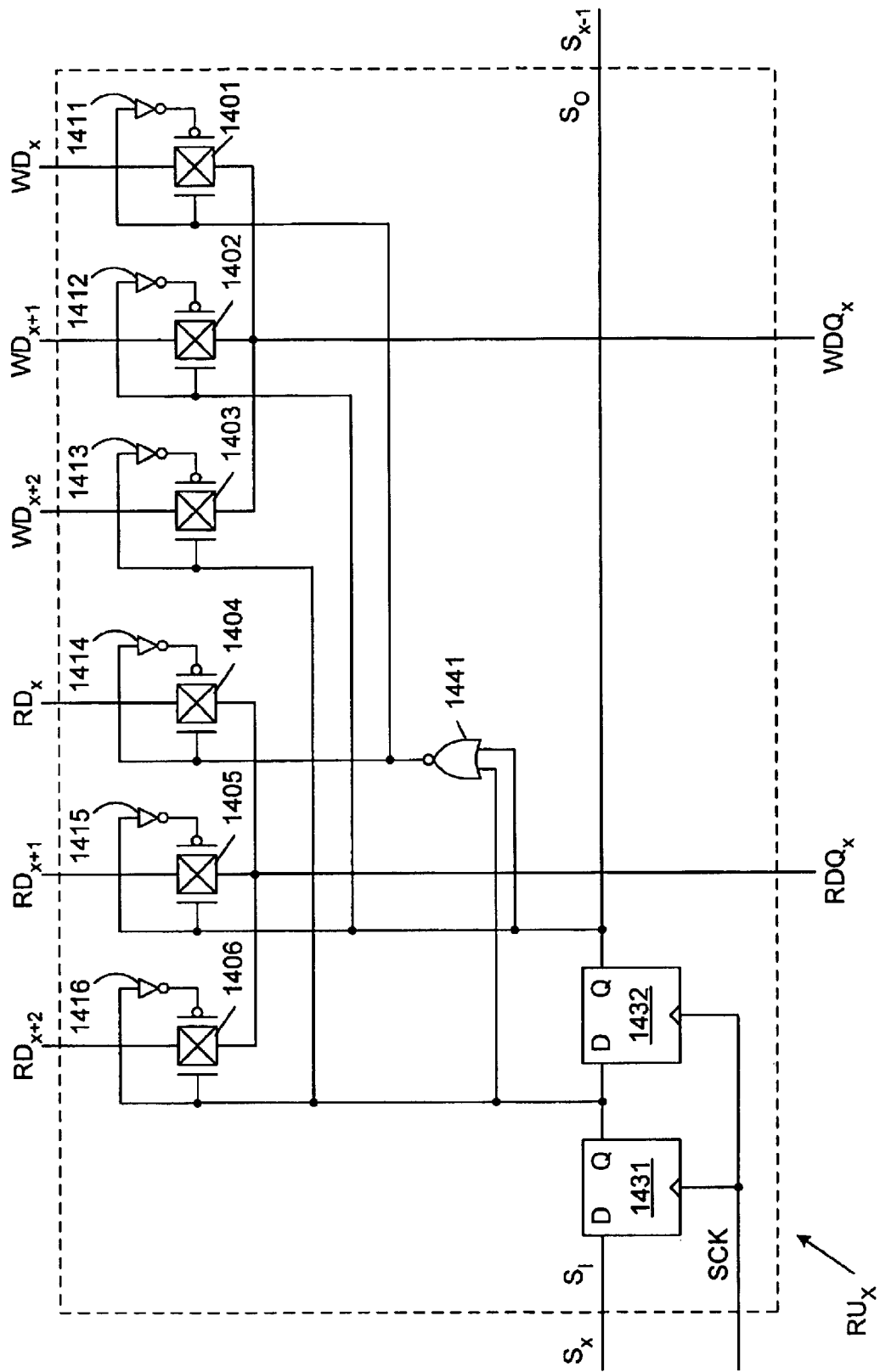
FIG. 14 is a circuit diagram of a routing unit for separately routing read and write data from and to a set of memory blocks in accordance with another embodiment of the invention.

The redundancy scheme described above can be easily extended to memory systems having separate read and write data paths. FIG. 14 is a circuit diagram of a routing unit $RU_x$ for separately routing read and write data from and to a set of memory blocks. Routing unit $RU_x$ is similar to routing unit $RU_n$ of FIG. 11. In the embodiment of FIG. 14, the internal data bus is separated into a set of read data lines $RD_{129}$–$RD_0$ and a set of write data lines $WD_{129}$–$WD_0$. The routing units couple the set of read data lines $RD_{129}$–$RD_0$ to a set of read data lines $RDQ_{127}$–$RDQ_0$. Similarly, the routing units couple the set of write data lines $WD_{129}$–$WD_0$ to a set of write data lines $WDQ_{127}$–$WDQ_0$. Routing unit $RU_x$ is coupled to read data lines $RDQ_x$, read data lines $RD_{x+2}$, $RD_{x+1}$, and $RD_x$, write data lines $WDQ_x$ and write data lines $WD_{x+2}$, $WD_{x+1}$ and $WD_x$. Routing unit $RU_x$ includes a first set of transmission gates 1401–1403 and inverters 1411–1413 which provides a connection between one of the write data lines $WD_{x+2}$, $WD_{x+1}$ and $WD_x$ and the write data line $WDQ_x$. Routing unit $RU_x$ similarly includes a second set of transmission gates 1404–1406 and inverters 1414–1416 which provides a connection between one of the read data lines $RD_{x+2}$, $RD_{x+1}$ and $RD_x$ and the read data line $RDQ_x$. Routing unit $RU_x$ uses a shifter circuit 1403 that is identical to the above-described shifter circuit 1103 (FIG. 11). Thus, shifter circuit 1403 includes a pair of flip flops 1431–1432 that are connected in the same manner as flip flops 1131–1132 (FIG. 11). Routing unit $RU_x$ also includes a NOR gate 1441 that is connected in a manner similar to NOR gate 1141 (FIG. 11).

Transmission gates 1401–1403 are controlled to function as a 3-to-1 de-multiplexer that routes a write data value from the write data line WDQx to one of the write data lines $WD_{x+2}$, $WD_{x+1}$ and $WD_x$. Transmission gates 1404–1406 are controlled to function as a 3-to-1 multiplexer that routes a read data value from one of the read data lines $RD_{x+2}$, $RD_{x+1}$ and $RD_x$ to the read data line RDQx. The multiplexing and de-multiplexing of the read and write data signals are controlled by select signals SEL2, SEL1 and SEL0. Routing unit $RU_x$ is programmed in the same manner as described above for routing unit $RU_n$ (FIGS. 11–13.)

Figure 15:
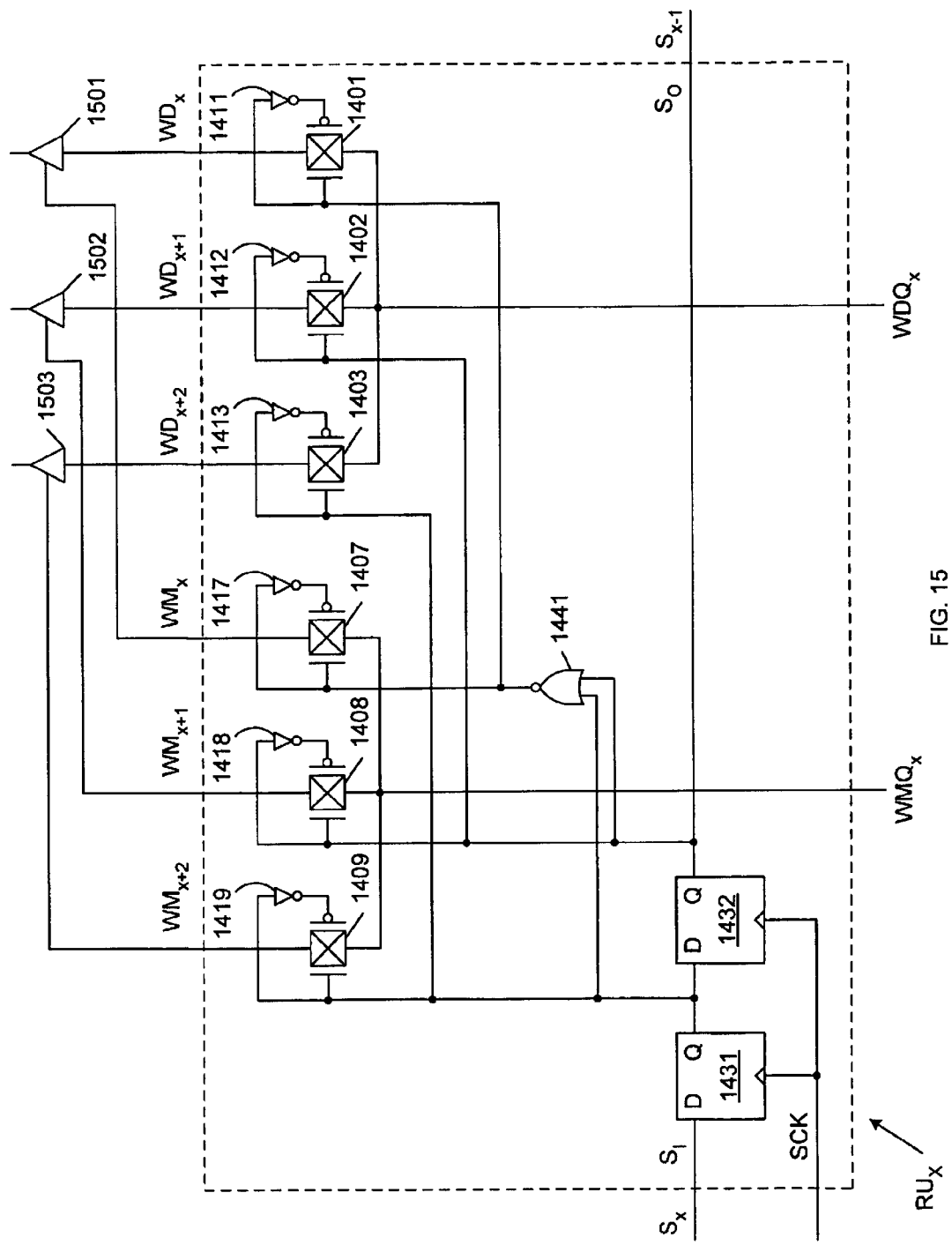
FIG. 15 is a circuit diagram of a routing unit for separately routing write data and write masking information in accordance with another embodiment of the present invention.

The present invention can also be extended to implement a memory system with write masking. FIG. 15 is a circuit diagram of a routing unit $RU_x$ for separately routing write data and write masking information (the read data routing path is not shown in FIG. 15 for purposes of clarity.) Similar elements in FIGS. 14 and 15 are labeled with similar reference numbers. Thus, the routing unit $RU_x$ of FIG. 15 includes transmission gates 1401–1403 and inverters 1411–1413, which provide a connection between one of the write data lines $WD_{x+2}$, $WD_{x+1}$ and $WD_x$ and the write data line $WDQ_x$. Routing unit $RU_x$ of FIG. 15 also includes flip flops 1431–1432 and NOR gate 1441.

In addition, routing unit $RU_x$ of FIG. 15 includes transmission gates 1407–1409 and inverters 1417–1419, which provide a connection between one of the write mask lines $WM_{x+2}$, $WM_{x+1}$ and $WM_x$ and the write mask line $WMQ_x$. Transmission gates 1407–1409 are configured to operate in the same manner as transmission gates 1401–1403. Thus, if write data value $WDQ_x$ is routed on one of write data lines $WD_{x+2}$, $WD_{x+1}$ or $WD_x$, then write mask signal $WMQ_x$ is routed on a corresponding one of write mask lines $WM_{x+2}$, $WM_{x+1}$ or $WM_x$, respectively.

Write data line $WD_x$ and write mask line $WM_x$ are coupled to input and enable terminals, respectively, of a write driver 1501 in column decoder $CD_x$. Similarly, write data line $WD_{x+1}$ and write mask line $WM_{x+1}$ are coupled to input and enable terminals, respectively, of a write driver 1502 in column decoder $CD_{x+1}$. Finally, line $WD_{x+2}$ and write mask line $WM_{x+2}$ are coupled to input and enable terminals, respectively, of a write driver 1503 in column decoder $CD_{x+2}$. In this manner, the write masking information is transmitted with the write data.

Although the invention has been described in connection with several embodiments, it is understood that this invention is not limited to the embodiments disclosed, but is capable of various modifications which would be apparent to a person skilled in the art. For example, although the invention has been described in connection with two redundant memory blocks, it is understood that the invention can be modified to include other numbers of redundant memory blocks (e.g., 1 or 3). Furthermore, although the routing units have been described as being loaded from a single shift chain, it is understood that multiple shift chains can be used to load configuration data into the routing units. In addition, it is understood that many types of memory blocks can be used in connection with the redundancy scheme of the present invention, including, but not limited to, DRAM, SRAM, EPROM, EEPROM and Flash EPROM. Moreover, although the redundancy scheme was described in connection with memory blocks, it is understood that the principles of the present invention can be applied to types of circuit blocks. Thus, the invention is limited only by the following claims.

What is claimed is:

1. A redundancy system comprising:
    a plurality of circuit blocks;
    a plurality of routing units configured to route read and write data between the circuit blocks and a data bus, wherein at least one shifter circuit extends through the routing units, the shifter circuit storing values for configuring the routing units; and
    a routing unit programmer for loading the shifter circuit through a routing unit.

2. The redundancy system of claim 1, wherein the shifter circuit comprises one or more series connected storage elements in each routing unit.

3. The redundancy system of claim 1, wherein each of the routing units includes a router coupled between a predetermined number of the circuit blocks and the data bus.

4. The redundancy system or claim 3, wherein each router is controlled by one or more values stored in the shifter circuit.

5. The redundancy system of claim 3, wherein each of the routers is configured to connect one of the circuit blocks to the data bus.

6. The redundancy system of claim 3, wherein the predetermined number is two or greater.

7. The redundancy system of claim 3, wherein each router includes a plurality of transmission gates coupled in parallel to the data bus.

8. The redundancy system of claim 3, wherein the predetermined number of circuit blocks are consecutive circuit blocks.

9. The redundancy system of claim 1, wherein the data bus includes a plurality of data lines used to transmit both read data and write data.

10. The redundancy system of claim 1, wherein the data bus includes a first set of data lines for carrying read data, and a second set of data lines for carrying write data.

11. The redundancy system of claim 1, wherein the routing unit programmer comprises:
    a first register for storing a first address associated with a first defective circuit block;
    a counter for sequentially providing addresses associated with all of the circuit blocks; and
    a first comparator coupled to the counter and the first register.

12. The redundancy system of claim 11, further comprising a first sequential logic element coupled to an output of the first comparator, wherein the shifter circuit is loaded through the first sequential logic element.

13. The redundancy system of claim 11, further comprising:
    a second register for storing a second address associated with a second defective circuit block; and
    a second comparator coupled to the counter and the second register.

14. The redundancy system of claim 13, further comprising:
    a first sequential logic element coupled to an output of the first comparator, a second sequential logic element coupled to an output terminal of the second comparator, wherein the first and second sequential logic elements are connected in a circular queue.

15. The redundancy system of claim 14, wherein the shifter circuit is loaded with valves from the first and second sequential logic elements.

16. A method of replacing defective circuit blocks with redundant circuit blocks, the method comprising the steps of:

identifying a first address of a first defective circuit block;

identifying a second address of a second defective circuit block;

serially loading values into a shifter circuit, wherein the values are selected in response to the first address response to the first address and the second address;

bypassing the first defective circuit block and the second defective circuit block in response to values stored in the shifter circuit; and connecting a first redundant circuit block in response to values stored in the shifter circuit;

connecting a first redundant circuit block and a second redundant circuit block in response to values stored in the shifter circuit.

17. The method of claim 16, further comprising the steps of:

shifting connections to one or more circuit blocks located between the second defective circuit block and the first defective circuit block by one position in response to values stored in the shifter circuit; and shifting connections to one or more circuit blocks located between the first and second redundant circuit blocks and the second defective circuit block by two positions in response to values stored in the shifter circuit.

18. The method of claim 16, wherein the step of serially loading values into the shifter circuit comprises the steps of:

storing the first address in a first register;

storing the second address minus one in a second register;

sequentially comparing the first address and the second address minus one with addresses associated with a set of circuit blocks;

loading a value into the shifter circuit;

modifying the value loaded into the shifter circuit when the first address matches an address associated with a circuit block in the set of circuit blocks; and modifying the value loaded into the shifter circuit when the second address minus one matches an address associated with a circuit block in the set of circuit blocks.

19. A method of replacing defective circuit blocks with redundant circuit blocks, the method comprising the steps of:

identifying a first address of a first defective circuit block;

serially loading values into a shifter circuit, wherein the values are selected in response to the first address, wherein the step of serially loading values into the shifter circuit comprises the steps of:

storing the first address in a first register; sequentially comparing the first address with addresses associated with a set of circuit blocks;

loading a value into the shifter circuit; and modifying the value loaded into the shifter circuit when the first address matches an address associated with a circuit block in the set of circuit blocks;

bypassing the first defective circuit block in response to values stored in the shifter circuit; and connecting a first redundant circuit block in response to values stored in the shifter circuit.

20. A method of replacing defective circuit blocks with redundant circuit blocks, the method comprising the steps of:

identifying a first address of a first defective circuit block;

identifying a second address of a second defective circuit block;

identifying a third address of a third defective circuit block;

serially loading values into a shifter circuit, wherein the values are selected in response to the first, second and third addresses;

bypassing the first, second and third defective circuit blocks in response to values stored in the shifter circuit; and connecting first, second and third redundant circuit blocks in response to values stored in the shifter circuit.

21. The method of claim 20, wherein the step of serially loading values into the shifter circuit further comprises the steps of:

storing the first address in a first register;

storing the second address minus one in a second register;

storing the third address minus two in a third register;

sequentially comparing the first address, the second address minus one, and the third address minus two with addresses associated with a set of circuit blocks;

loading a value into the shifter circuit;

modifying the value loaded into the shifter circuit when the first address matches an address associated with a circuit block in the set of circuit blocks;

modifying the value loaded into the shifter circuit when the second address minus one matches an address associated with a circuit block in the set of circuit blocks;

modifying the value loaded into the shifter circuit when the third address minus two matches an address associated with a circuit block in the set of circuit blocks.

* * * * *

UNITED STATES PATENT AND TRADEMARK OFFICE
CERTIFICATE OF CORRECTION

PATENT NO. : 6,732,229 B1
DATED : May 4, 2004
INVENTOR(S) : Wingyu Leung et al.

It is certified that error appears in the above-identified patent and that said Letters Patent is hereby corrected as shown below:

Title page,
Item [56], References Cited, U.S. PATENT DOCUMENTS, insert

-- 5,255,227   10/1993   Haeffele
  6,055,204   04/2000   Bosshart --

Column 3,
Line 45, insert -- in -- before "accordance".

Column 4,
Lines 2 and 6, insert -- in -- before "accordance".

Column 17,
Line 64, delete "to" (first occurrence).

Column 21,
Line 15, replace "WDQx" with -- $WDQ_x$ --.
Line 19, replace "RDQx" with -- $RDQ_x$ --.

Column 22,
Line 21, replace "series connected" with -- series-connected --.

Column 23,
Line 6, replace "valves" with -- values --.
Line 16, delete "response to the first address".

Signed and Sealed this

Twenty-first Day of December, 2004

JON W. DUDAS
*Director of the United States Patent and Trademark Office*